(12) United States Patent
Leizerovich et al.

(10) Patent No.: US 12,101,111 B2
(45) Date of Patent: Sep. 24, 2024

(54) SMALL CELL ACCESS NODE WITH WATER INTRUSION MITIGATION

(71) Applicant: Ubicquia, Inc., Fort Lauderdale, FL (US)

(72) Inventors: Gustavo Dario Leizerovich, Aventura, FL (US); Claudio Santiago Ribeiro, Evanston, IL (US); Cesar Eduardo Nunez, Miramar, FL (US); Fernando Ferrales, Fort Lauderdale, FL (US)

( * ) Notice: Subject to any disclaimer, the term of this patent is extended or adjusted under 35 U.S.C. 154(b) by 227 days.

(21) Appl. No.: 17/952,228

(22) Filed: Sep. 24, 2022

(65) Prior Publication Data
US 2023/0208463 A1 Jun. 29, 2023

Related U.S. Application Data

(63) Continuation-in-part of application No. 17/952,183, filed on Sep. 23, 2022, and a continuation-in-part of
(Continued)

(51) Int. Cl.
*H05K 7/20* (2006.01)
*H04B 1/38* (2015.01)
(Continued)

(52) U.S. Cl.
CPC .............. *H04B 1/38* (2013.01); *H04B 7/0413* (2013.01); *H05K 7/20136* (2013.01); *H05K 9/006* (2013.01)

(58) Field of Classification Search
CPC ...... H05K 7/20136; H05K 9/006; H04B 1/38; H04B 7/0413
See application file for complete search history.

(56) References Cited

U.S. PATENT DOCUMENTS 4,370,700 A * 1/1983 Duddles ............... H05K 9/0037
361/752
5,777,856 A * 7/1998 Phillips ............... H04M 1/0277
361/752
(Continued)

FOREIGN PATENT DOCUMENTS

CN 211702797 U 10/2020
EP 2034328 A1 * 3/2009 ............. G01S 7/032

OTHER PUBLICATIONS

EP-2034328-A1 English translation (Year: 2009).*
(Continued)

*Primary Examiner* — Mukundbhai G Patel
(74) *Attorney, Agent, or Firm* — Daniel C. Crilly; Scott Garrett

(57) ABSTRACT

A small cell access node includes a housing, a radio module, a power supply module, and one or more antennas coupled to the radio module. The housing includes a floor and at least one sidewall extending around a perimeter of the floor. An air intake section of the sidewall is located at a first lengthwise end of the floor and defines an air intake port. An air exhaust section of the sidewall is located at a second lengthwise end of the floor and defines an air exhaust port. The floor includes a two floor portions residing primarily in different planes and an angled transition portion interconnecting the two floor portions. The transition portion defines an air and water exhaust port to allow water that enters the housing through the air intake and air exhaust ports, such as from wind-driven rain, to drain out of the housing.

16 Claims, 16 Drawing Sheets

Related U.S. Application Data application No. 17/567,116, filed on Jan. 1, 2022, now Pat. No. 11,844,151, and a continuation-in-part of application No. 17/563,783, filed on Dec. 28, 2021, now Pat. No. 11,792,964.

(51) Int. Cl.
  *H04B 7/0413* (2017.01)
  *H05K 9/00* (2006.01)

(56) References Cited

U.S. PATENT DOCUMENTS

| | | | |
|---|---|---|---|
| 6,364,216 | B1 | 4/2002 | Martin |
| 6,624,432 | B1 | 9/2003 | Gabower et al. |
| 8,018,734 | B2 * | 9/2011 | Brewer ............... H05K 5/0278 361/818 |
| 9,192,079 | B2 * | 11/2015 | Loth ................. H05K 7/20918 |
| 11,653,436 | B2 | 5/2023 | Vendetti et al. |
| 11,792,964 | B2 | 10/2023 | Leizerovich et al. |
| 11,844,151 | B2 | 12/2023 | Leizerovich et al. |
| 2018/0027359 | A1 | 1/2018 | Gonzalez et al. |
| 2018/0045388 | A1 | 2/2018 | McDowell et al. |
| 2019/0341732 | A1 | 11/2019 | Zimmerman, III et al. |
| 2020/0080695 | A1 | 3/2020 | Lalos et al. |
| 2020/0195304 | A1 | 6/2020 | Vannucci et al. |
| 2020/0359462 | A1 | 11/2020 | Zimmerman, III et al. |
| 2020/0373682 | A1 | 11/2020 | Root et al. |
| 2021/0100065 | A1 * | 4/2021 | Lee ..................... H05K 7/1417 |
| 2021/0167811 | A1 | 6/2021 | Henry et al. |
| 2021/0305689 | A1 | 9/2021 | Leizerovich |

OTHER PUBLICATIONS

U.S. Patent & Trademark Office as International Searching Authority, International Search Report issued in connection with International Application No. PCT/US22/54121, Apr. 18, 2023, 2 pages.

U.S. Patent & Trademark Office as International Searching Authority, Written Opinion of the International Searching Authority in connection with International Application No. PCT/US22/54121, Apr. 18, 2023, 6 pages.

U.S. Patent & Trademark Office as International Searching Authority, International Search Report issued in connection with International Application No. PCT/US22/54128, Apr. 5, 2023, 2 pages.

U.S. Patent & Trademark Office as International Searching Authority, Written Opinion of the International Searching Authority in connection with International Application No. PCT/US22/54128, Apr. 5, 2023, 4 pages.

U.S. Patent & Trademark Office as International Searching Authority, International Search Report issued in connection with International Application No. PCT/US22/54123, Jun. 21, 2023, 4 pages.

U.S. Patent & Trademark Office as International Searching Authority, Written Opinion of the International Searching Authority in connection with International Application No. PCT/US22/54123, Jun. 21, 2023, 5 pages.

U.S. Patent & Trademark Office as International Searching Authority, International Search Report issued in connection with counterpart International Application No. PCT/US22/54126, Mar. 21, 2023, 2 pages.

S. Patent & Trademark Office as International Searching Authority, Written Opinion of the International Searching Authority in connection with counterpart International Application No. PCT/US22/54126, Mar. 21, 2023, 4 pages.

* cited by examiner

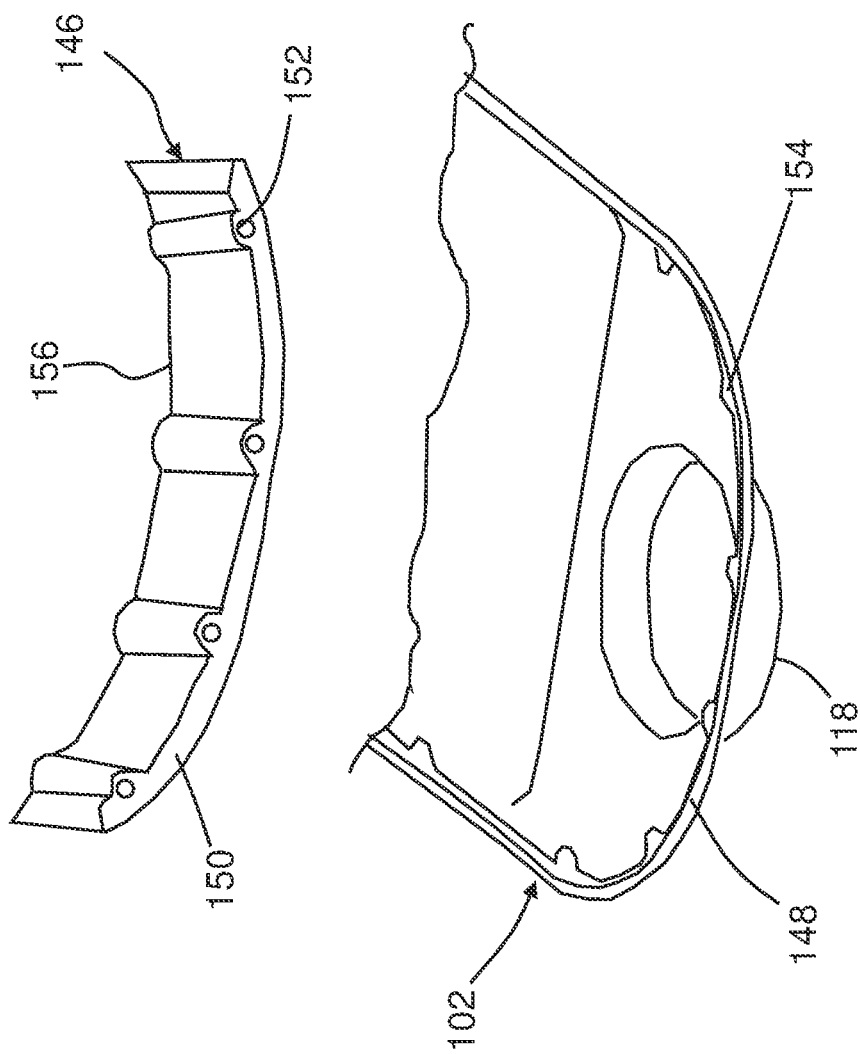

SMALL CELL ACCESS NODE WITH WATER INTRUSION MITIGATION

CROSS-REFERENCE TO RELATED APPLICATIONS

The present application is a continuation-in-part of U.S. application Ser. No. 17/563,783, which application was filed on Dec. 28, 2021, and is incorporated herein by this reference as if fully set forth herein. The present application is also a continuation-in-part of U.S. application Ser. No. 17/567,116, which application was filed on Jan. 1, 2022, and is incorporated herein by this reference as if fully set forth herein. The present application is further a continuation-in-part of U.S. application Ser. No. 17/952,183, which application was filed on Sep. 23, 2022, and is incorporated herein by this reference as if fully set forth herein.

TECHNICAL FIELD

The present disclosure relates generally to small cell access node communications equipment, and, more particularly, relates to a shielded enclosure for a combination controller and power supply module for a small cell access node, and an access node using same.

BACKGROUND

Wireless communication service is in widespread use, with a rapidly increasing number of devices being deployed that need wireless connectivity. In particular, as people use their mobile devices more for data services than voice calls, there is an increasing need for data access. Given that there is a limitation on available radio bandwidth for such services, service provides are scaling down service areas so that spectrum allocation can be repeated in smaller cells. This means that rather than using towers that cover conventional cell regions under prior systems, which can be miles across, new systems will use small cells that are more like wireless local area networks than traditional cellular communications cells. As a result, small cell access nodes will be deployed in much higher numbers than traditional cellular base stations.

There are a couple challenges with deploying small cell access nodes, which are deployment locations, and avoiding noise that can affect receiver performance. The noise can include noise generated by the small cell access node itself, such as, for example, passive intermodulation distortion.

SUMMARY

In accordance with some exemplary embodiments of the present disclosure, a small cell access node includes a housing, a radio transceiver module, a power supply module, an electrical power connector, and a plurality of antennas. The housing includes a floor and at least one sidewall extending around a perimeter of the floor. The sidewall includes an air intake section located at a first lengthwise end of the floor. The air intake section defines an air intake port. The sidewall also includes an air exhaust section located at a second lengthwise end of the floor. The air exhaust port defines an air exhaust port. The floor includes a first floor portion residing primarily in a first plane, a second floor portion residing primarily in a second plane, and a transition portion interconnecting the first floor portion and the second floor portion. The transition portion defines an air and water exhaust port. The radio transceiver module is positioned within the housing over and spaced apart from the first floor portion so as to form a first air and water flow channel between the radio transceiver module and the first floor portion. The power supply module is positioned within the housing over at least the second floor portion and spaced apart from the second floor portion so as to form a second air and water flow channel between the power supply module and the second floor portion. The electrical power connector is positioned in an opening defined by the second floor portion of the housing and electrically coupled to the power supply module. The electrical power connector is connectable to an external power connector of a lighting fixture. The antennas are configured in a predetermined arrangement within the housing and are electrically coupled to the radio transceiver module.

In accordance with other exemplary embodiments of the present disclosure, a small cell access node includes an electrically conductive lower housing member, an electrically non-conductive sidewall housing member, a dam, a cover, a radio module, and a shield enclosure. The lower housing member includes a floor and a wall proximate a first end of the floor. The wall defines an air intake port, and the floor defines an air and water exhaust port. The sidewall housing member is attached to the floor and the wall of the lower housing member and defines an air exhaust port. The sidewall housing member is attached to the lower housing member such that the air exhaust port is positioned proximate a second end of the floor. The dam is positioned proximate the air exhaust port and includes a solid dam wall that is spaced from the air exhaust port so as to allow air to flow over a top of the dam wall and through the air exhaust port. The dam wall is impassible to liquid. The cover is attached to a top portion of the sidewall housing member, wherein the cover, the lower housing member, and the sidewall housing member define an internal chamber of a housing. The radio module is positioned within the internal chamber closer to the air intake port than the air exhaust port. The shield enclosure is positioned within the internal chamber between the radio module and the air exhaust port. The shield enclosure is electrically coupled to the lower housing member and includes at least a power supply module.

In accordance with an alternative exemplary embodiment, the floor of the lower housing member includes a first floor portion residing primarily in a first plane, a second floor portion residing primarily in a second plane, and a transition portion interconnecting the first floor portion and the second floor portion. In this case, the transition portion may be angled and defines an air and water exhaust port. The first and second floor portions may be sloped or angled toward the transition portion to direct any water or other liquid entering the internal chamber through the air intake port or the air exhaust port toward the air and water exhaust port.

In accordance with other exemplary embodiments of the present disclosure, a small cell access node includes a housing defining an internal chamber. The housing has a floor and a rear side wall that has an air intake port that allows air to pass from outside the housing into the housing. The housing further includes a sidewall member formed around the floor from a first side of the rear side wall around a front of the floor and to a second side of the rear side wall. The sidewall member is electrically non-conductive and has a front exhaust port at a front of the small cell access node device. The floor of the housing is electrically conductive and has a first portion from the rear side wall to a transition section, and a second portion that extends from the transition portion to a front end of the housing that is opposite the back wall. There is at least one air and water exhaust formed in the transition portion. The device further includes a radio transceiver module disposed in the internal chamber of the housing over the first portion of the floor and mounted on the first portion of the floor such there is a channel between the radio transceiver module and the first portion of the floor. The device also includes a dual controller and power supply module disposed over the second portion of the floor and which is spaced apart from the second portion of the floor. The device also has an electrical power connector disposed in an opening through the second portion of the floor that is configured to connect to a lighting fixture. The device further includes a plurality of planar antenna elements including at least a first planar antenna element and a second planar antenna element. Each of the first and second planar antenna elements are disposed in the housing on opposite sides of either the radio transceiver module or the dual controller and power supply module within the housing, and each one of the plurality of planar antenna elements connected to the radio transceiver module via an antenna cable.

In accordance with some embodiments of the present disclosure, there is provided an integrated small cell access node apparatus that includes a lower housing member having a floor that is electrically conductive. The lower housing member has a rear sidewall that has an intake port through which air is drawn. The floor has a rear portion and a front portion, with the rear portion being lower than the front portion. There is a transition section between the rear portion and the front portion. There is also an exhaust port made up of a plurality of openings in the transition section. The apparatus further includes a sidewall member disposed about a periphery of the floor, the sidewall member being electrically non-conductive. Further, the sidewall member has a front exhaust port formed at a front of the integrated small cell access node apparatus. The is also a cover engaged with the sidewall opposite the floor that is non-conductive, and there is an internal chamber is defined within the housing by the floor, sidewall, and cover. The apparatus also has a shielded enclosure for a combination power supply and controller module disposed in the internal chamber of the housing and conductively coupled to the floor of the housing. The shielded enclosure has a lower chamber and an upper chamber in a vertically stacked relationship, and a photo sensor port disposed in top of the shielded enclosure that sits under window in the cover. The apparatus further includes a radio module disposed in the internal chamber at a rear of the internal chamber and which is raised above the floor to create a channel under the radio module.

In accordance with some embodiments of the present disclosure, there is provided a small cell access node device that includes a lower housing member made of an electrically conductive material. The lower housing member has a floor and a back wall at a first end of the lower housing member having an intake port. The device further includes a sidewall housing member made on an electrically non-conductive material and which is connected to the lower housing member about a periphery of the lower housing member, and which forms a wall around the floor. There is an exhaust port formed in the sidewall housing member at a front of the small cell access node device. The device also has a dam disposed adjacent the front exhaust port having a vertical wall that is spaced away from the front exhaust port to allow air to flow over a top of the dam and through the exhaust port, wherein the vertical wall is solid and impassible to liquid. There is also a cover that engages a top of the sidewall housing member about a periphery of the top of the sidewall housing member. An internal chamber is defined between the floor, the cover, the sidewall housing member, and the back wall of the lower housing member. The device further has a radio module disposed in the internal chamber proximate the back wall of the lower housing member. The device also includes a shielded enclosure for a combination power supply and controller module disposed in the internal chamber proximate to a second end of the lower housing member and horizontally adjacent the radio module, the shielded enclosure being conductively coupled to the floor of the lower housing member.

Although the present disclosure illustrates and describes a small cell access node apparatus, and a vertically stacked electrical module, it is, nevertheless, not intended to be limited to the details shown because various modifications and structural changes may be made therein without departing from the spirit of the disclosure and while remaining within the scope and range of equivalents of the claims. Additionally, well-known elements of the invention will not be described in detail or will be omitted so as not to obscure the relevant details of the invention.

Features that are considered characteristic of the invention are set forth in the appended claims. As required, detailed embodiments of the small cell housing are disclosed herein; however, it is to be understood that the disclosed embodiments are merely exemplary, and the housing may be embodied in various forms. Therefore, specific structural and functional details disclosed herein are not to be interpreted as limiting, but merely as a basis for the claims and as a representative basis for teaching one of ordinary skill in the art to variously employ the claimed invention in appropriately detailed structures. Further, the terms and phrases used herein are not intended to be limiting; but rather, to provide an understandable description of the disclosure. While the specification concludes with claims defining the features of the invention, it is believed that the claimed invention will be better understood from a consideration of the following description in conjunction with the drawing figures, in which like reference numerals are carried forward. The figures of the drawings are not drawn to scale.

The terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

As used in this description, unless otherwise specified, azimuth or positional relationships indicated by terms such as "up," "down," "left," "right," "inside," "outside," "front," "back," "head," "tail," and so on, are azimuth or positional relationships based on the drawings, which are only to facilitate description of the embodiments of the present invention and simplify the description, but not to indicate or imply that the devices or components must have a specific azimuth, or be constructed or operated in the specific azimuth, which thus cannot be understood as a limitation to the embodiments of the present invention. Furthermore, terms such as "first," "second," "third," and so on are only used for descriptive purposes and cannot be construed as indicating or implying relative importance.

As used in this description, unless otherwise clearly defined and limited, terms such as "installed," "coupled," and "connected" should be broadly interpreted, for example, it may be fixedly connected, or may be detachably connected, or integrally connected; it may be mechanically connected, or may be electrically connected; it may be directly connected or may be indirectly connected via an intermediate medium. As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. In this document, the term "longitudinal" should be understood to mean lengthwise or in a direction corresponding to an elongated direction of the device. Those skilled in the art can understand the specific meanings of the above-mentioned terms in the embodiments of the present disclosure according to the specific circumstances.

In the absence of any specific clarification related to its express use in a particular context, where the term "substantially" in any grammatical form is used as a modifier in the present disclosure and any appended claims (e.g., to modify a structure, a dimension, a measurement, or some other characteristic), it is understood that the characteristic may vary by up to 30 percent. For example, an element or characteristic thereof may be described as being "substantially identical" to another element or characteristic. In such a case, the two elements or characteristics may be identical or vary to within 30 percent of their respective dimensions.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present disclosure.

FIG. 16 shows an exploded perspective view of the front portion of the lower housing member with a dam member that prevent water ingress at a front exhaust port, in accordance with some embodiments.

DETAILED DESCRIPTION

Figure 1:
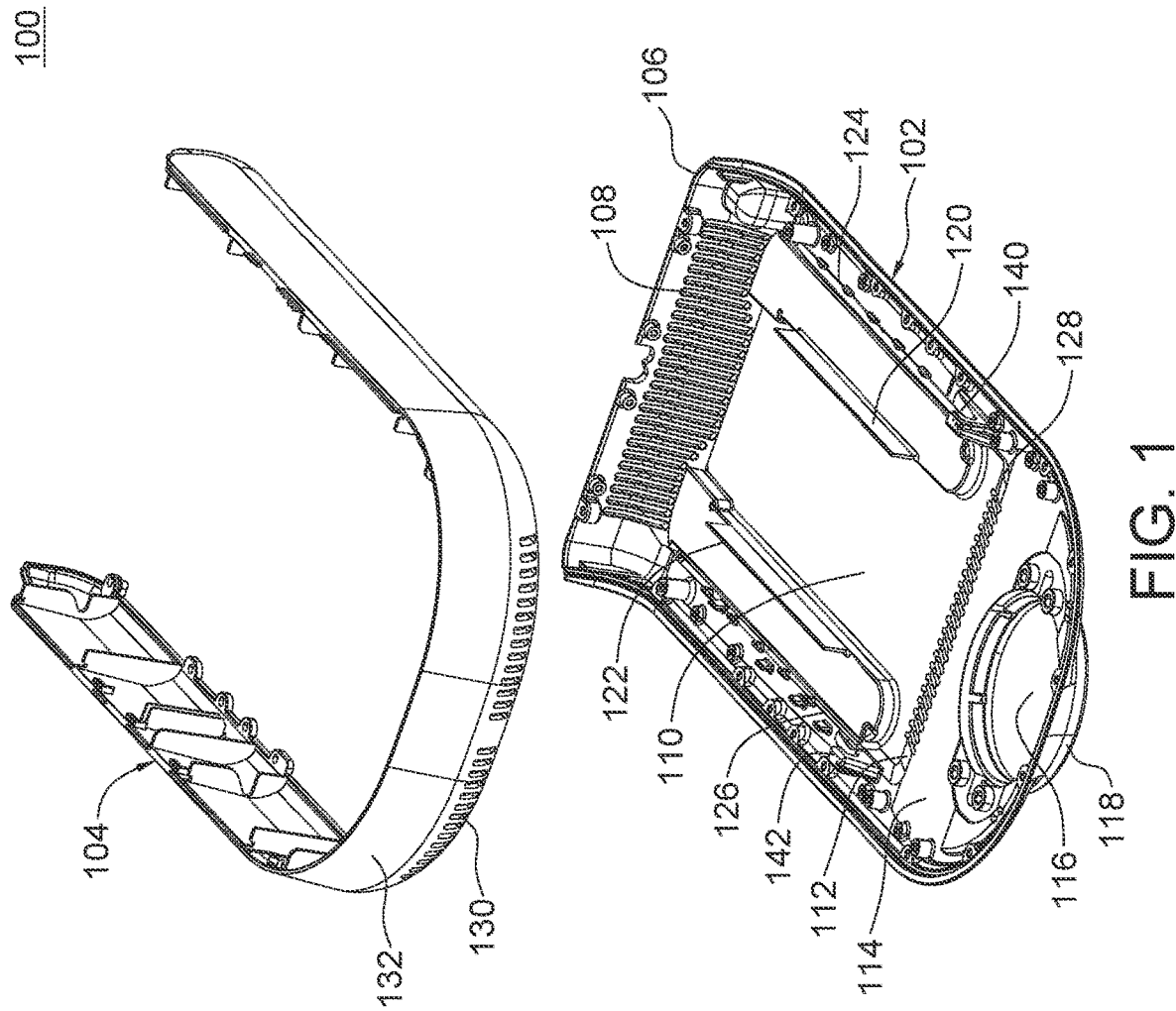
FIG. 1 shows a perspective exploded view of a small cell access node device for housing the electrical and electronic components of the small cell access node device, in accordance with some embodiments of the present disclosure.

FIG. 1 shows a perspective exploded view of a partial housing assembly 100 for an apparatus or device such as, for example, a small cell access node device, for housing the electrical and electronic components of the device, in accordance with some embodiments of the present disclosure. A small cell access node device is a telecommunications device that facilitates, among other things, communication between mobile devices and a telecommunications infrastructure. The subsequent drawings also show the housing assembly in various states and from various views, so like reference numerals are used throughout the drawings. Accordingly, reference can be made to any or all of the drawings in the following description.

In general, the housing assembly is arranged to house one or more electrical module that can include a power supply, radio circuitry, control circuitry, and peripheral circuitry. The device accomplishes this by drawing air in (cool air) at one end of an of the device, routing the intake air through one or more air flow channels under the electric module(s), and utilizing two separate exhaust ports for exhausting heated air out of the device at the end of the device opposite the intake. The exhaust ports are arranged in stages such a one exhaust port is located between the end of the device, at a bottom of the housing, and a second exhaust port is located at the opposite end of the device from the intake port.

As shown in the drawings, and referring to FIG. 1, there is shown a lower housing member 102 and a sidewall housing member 104. These members 102, 104 form a housing having a floor portion and a sidewall portion. The lower housing member 102 defines a floor and includes a back wall 106 that has an air intake section including an intake port 108 formed in the back wall 106. The back wall 106 can be considered a sidewall portion and is located at a first lengthwise end of the lower housing member 102 and has a width, in the horizontal direction, that is approximately equal to a width of the first floor portion 110 in a direction perpendicular to the lengthwise direction. The intake port 108 is comprised or one or more openings or air intake apertures through which air can be pulled into the housing from the outside, and into the device. The openings can be holes, slits, or any other shape, sized to prevent ingress of foreign matter. Alternatively, the opening(s) can be covered with a screen or mesh to keep out foreign matter. The lower housing member 102 is made of an electrically conductive material, such as aluminum or a lightweight alloy, to provide sufficient rigidity and structure support of the components housed in the housing assembly. Further, making the lower housing member 102 of a metal provides a grounding plane for electrical and electronic components housed in the housing assembly.

The floor of the lower housing member 102 can include the first floor portion 110, which is a generally flat surface that is oriented horizontally when the device is horizontally oriented. The first floor portion extends substantially from the back wall 106 forward to the lower end 140 of a transition portion 112. The second floor portion 114 extends from the upper end 142 of the transition portion 112 forward to the second lengthwise end 144 of the lower housing member 102. The transition portion 112 is between the first floor portion 110 and a second floor portion 114, that is also generally flat, defining a plane that is parallel, but not coplanar with a plane of the first floor portion 110. That is, the first floor portion 110 and the second floor portion 114 are at different levels, and the transition portion 112 joins the two floor portions 110, 114. In some embodiments the transition portion 112 can be an angle less than ninety degrees relative to the two floor portions 110, 114, and in some embodiments the transition portion 112 can be at an angle of five to forty five degrees relative to the floor portions 110, 114, or alternatively, to the horizontal direction when the device is properly mounted and leveled. The transition portion 112 include a first exhaust port 128 that, like the intake port 108, is formed of a plurality of air exhaust apertures through which air can escape. In some embodiments the openings can be a series of longitudinal slits oriented in the lengthwise direction of the lower housing member 102. In some embodiments at least some of the openings in the first exhaust port 128 extend to the first floor portion 110 to facilitate water drainage out of the housing assembly 100 in the event of water ingress into the housing assembly 100. In some embodiments the first floor portion 110 and the second floor portion 114 can be slightly angled in order to direct any water that enters the device to flow across the floor portions 110, 114 towards the first exit port 128 to drain out of the device.

The second floor portion 114 can include an opening 116 that is sized to house a vertically oriented electrical connector (not shown here), such as an electrical connector (e.g., 138) configured to connect to an outdoor lighting fixture (e.g., a streetlight fixture). The electrical connector can be configured to connect to a lighting utility, such as a streetlight, as defined, for example, by the National Electrical Manufacturers Association (NEMA). Specifically, the connector can be a three conductor twist locking type. A boss 118 extends downward from the bottom of the lower housing member 102 around the opening 116 to support the electrical connector. The electrical connector can include a housing that fits within the opening 116 that seals the opening to weather.

The first floor portion 110 can include one or more medial walls, such as, for example, walls 120, 122. The walls 120, 122 run in the lengthwise direction of the lower housing member 102 from the back wall 106 towards the opposite end. The walls 120, 122 are raised portions that, when other components of the device are placed into the housing assembly 100, form air flow channels. For example, the walls 120, 122 can be spaced a distance from the sidewall to define air flow channels 124, 126 between the walls 120, 122, and the sidewall. The main or central air flow channel between the walls 120, 122 can be used to cool a heat-generating electrical module positioned over, but spaced apart from the first floor portion 110, with the heated air primarily exiting through the first exhaust portion 128. Side flow air channels 124, 126 can be used to route cool air around the space between walls 120, 122 to the front of the housing assembly, and to the second floor portion 114 where it can cool another heat-generating electrical module, with the air being exhausted through the second exhaust port 130 at the front 132 of the sidewall housing member 104.

The sidewall housing member 104 as shown here is a "U" shaped member that, along with back wall 106 provides the vertical sidewall of the housing from the lower housing member 102, and which, along with the other housing members, defines a volume inside the device that can be on the order of 7,000 cubic centimeters±50%. The sidewall housing member 104 connects to the lower housing member 102 around a periphery of the lower housing member 102 and abuts the back wall 106 of the lower housing member 102 at opposite ends of the back wall 106. The back wall 106, in some embodiments, can rise up a portion of the sidewall housing member 104. The sidewall housing member 104 has a front 132 that is positioned opposite the back wall 106 of the lower housing member 102. A second exhaust port 130 is formed at the front 132 of the sidewall housing member 104. The second exhaust port 130 comprises one or more openings or air exhaust apertures through the sidewall member that allows air inside the sidewall housing member 104 to pass through the sidewall housing member 104. The overall height of assembled housing can be on the order of 30-150 millimeters.

Referring briefly to FIG. 16, there is shown an exploded perspective view of the front portion 148 of the lower housing member 102 with a dam member 146 that prevents water ingress at a front/second exhaust port 130, in accordance with some embodiments. The dam 146 includes a lower flange 150 that has holes 152 for fastener to attach the dam 146 to the front 148 of the lower housing member 102. The holes 152 in the flange 150 each mate with a corresponding boss 154 that receives a threaded fastener in a threaded bore in the boss 154. A vertical wall 156 is provided at substantially a right angle to the flange 150 and has a height of approximately the height of the slots/opening in the second exhaust port 130. The dam 146 act as a barrier to wind-blown rain and allows water droplets incident on the vertical wall 156 to collect and flow to the bottom of the dam 146, and under the dam 146 to flow out of the first exhaust port 128. That is, the vertical wall 156 is impassible to liquid and prevents water from passing beyond the wall 156.

Figure 2:
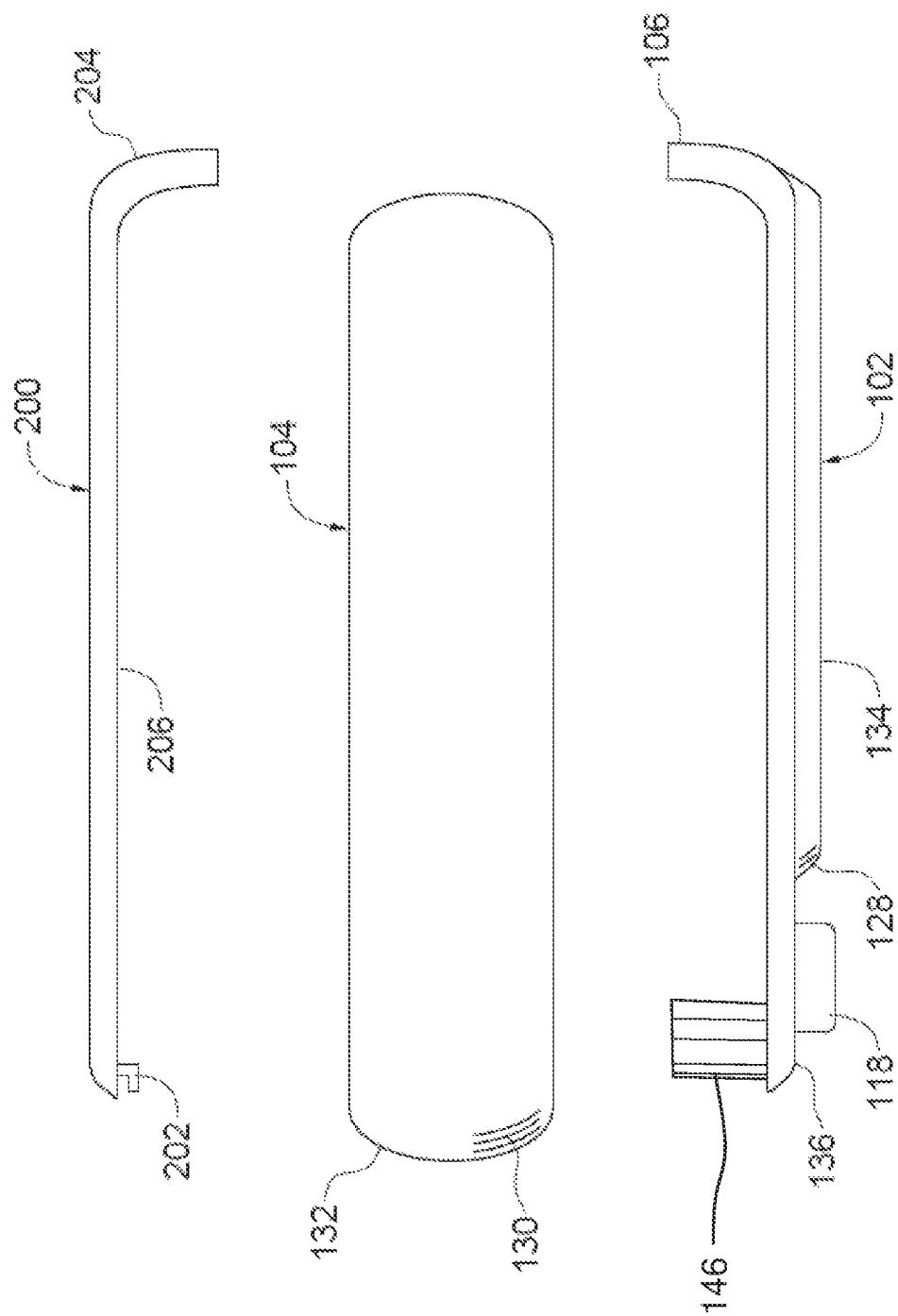
FIG. 2 shows a side elevational exploded view of a small cell access node device, in accordance with some embodiments of the present disclosure.

FIG. 2 shows a side elevational exploded view of a housing assembly for a small cell access node device, in accordance with some embodiments. In addition to the lower housing member 102, and the sidewall housing member 104, there is shown a cover housing member 200 that engages the top of the sidewall housing member 104. The cover housing member 200 can slide into engagement using a front catch feature 202. The cover housing member 200 also have a back wall portion 204 that can complement and align with the back wall 106 of the lower housing member 102 when the housing members 102, 104, 200 are assembled together to provide a complete cover of the back/rear of the housing assembly. The lower side edges 206 of the cover housing member 200 can have features to engage corresponding slide rail/track retention features in the sidewall housing member 104 on the inside top edge of the sidewall housing member 104. In this view, the underside 134 of the first floor portion 110 can be seen on the exterior bottom surface of the lower housing member 102. Likewise, the underside 136 of the second floor portion 114 can be seen adjacent the boss 118. The sidewall housing member 104 and the cover 200 are made of a dielectric material, such as plastic, which can include, for example, polyvinyl chloride (PVC), to allow electromagnetic signals to pass through the sidewall housing member 104 and cover 200 as well as to reduce the weight of the small cell device. The dam 146 is shown attached to the front of the lower housing member 102 and provides a barrier to wind-blown rain that comes through the second exhaust port 130. The top of the dam 146, however, is free, not being connected to anything else, allowing air to flow over the dam 146 (having been blown by fan unit 708) and out the second exhaust port 130 for cooling.

Figure 3:
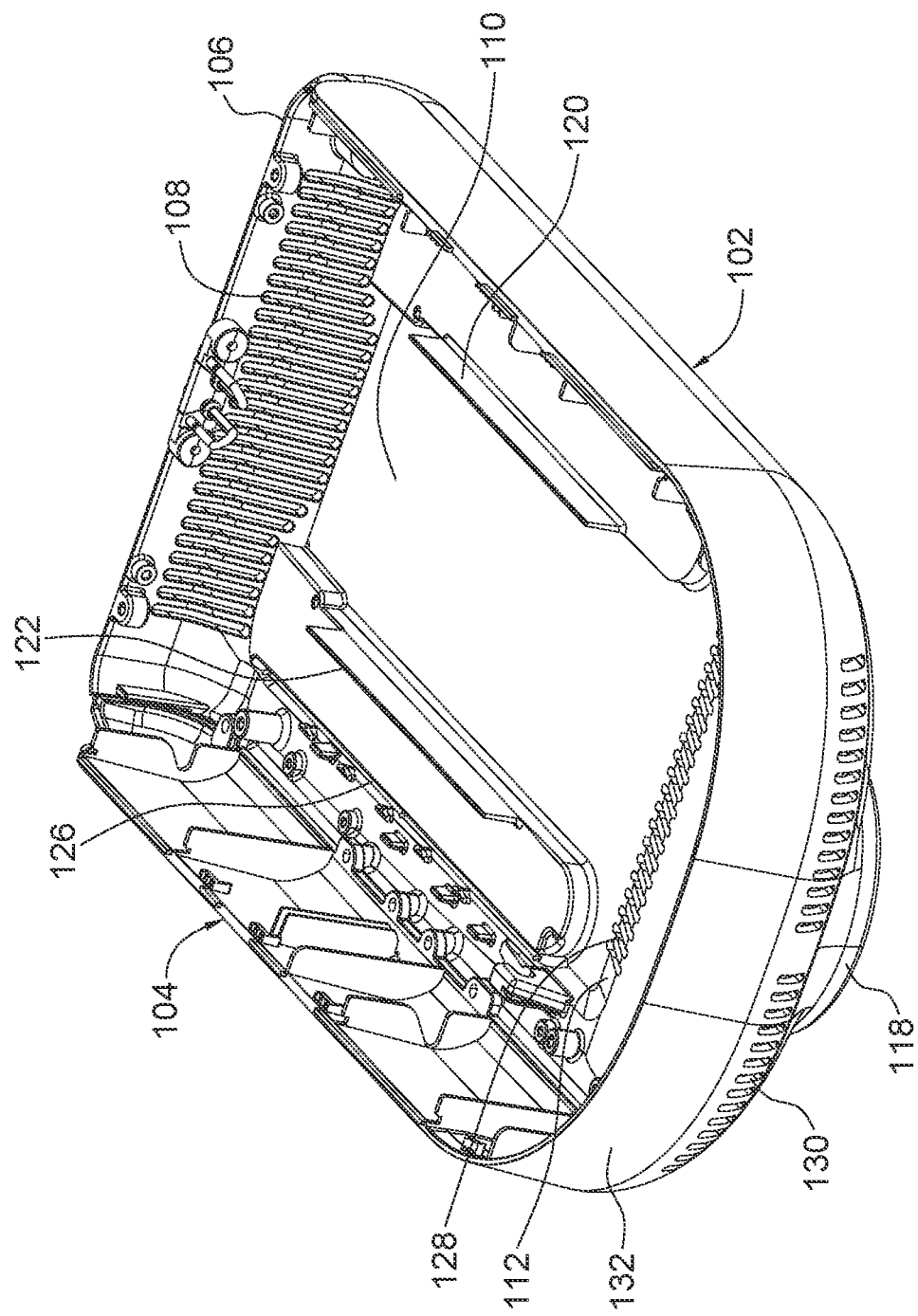
FIG. 3 shows a front perspective view partially assembled housing system for a small cell access node device, in accordance with some embodiments of the present disclosure.
Figure 4:
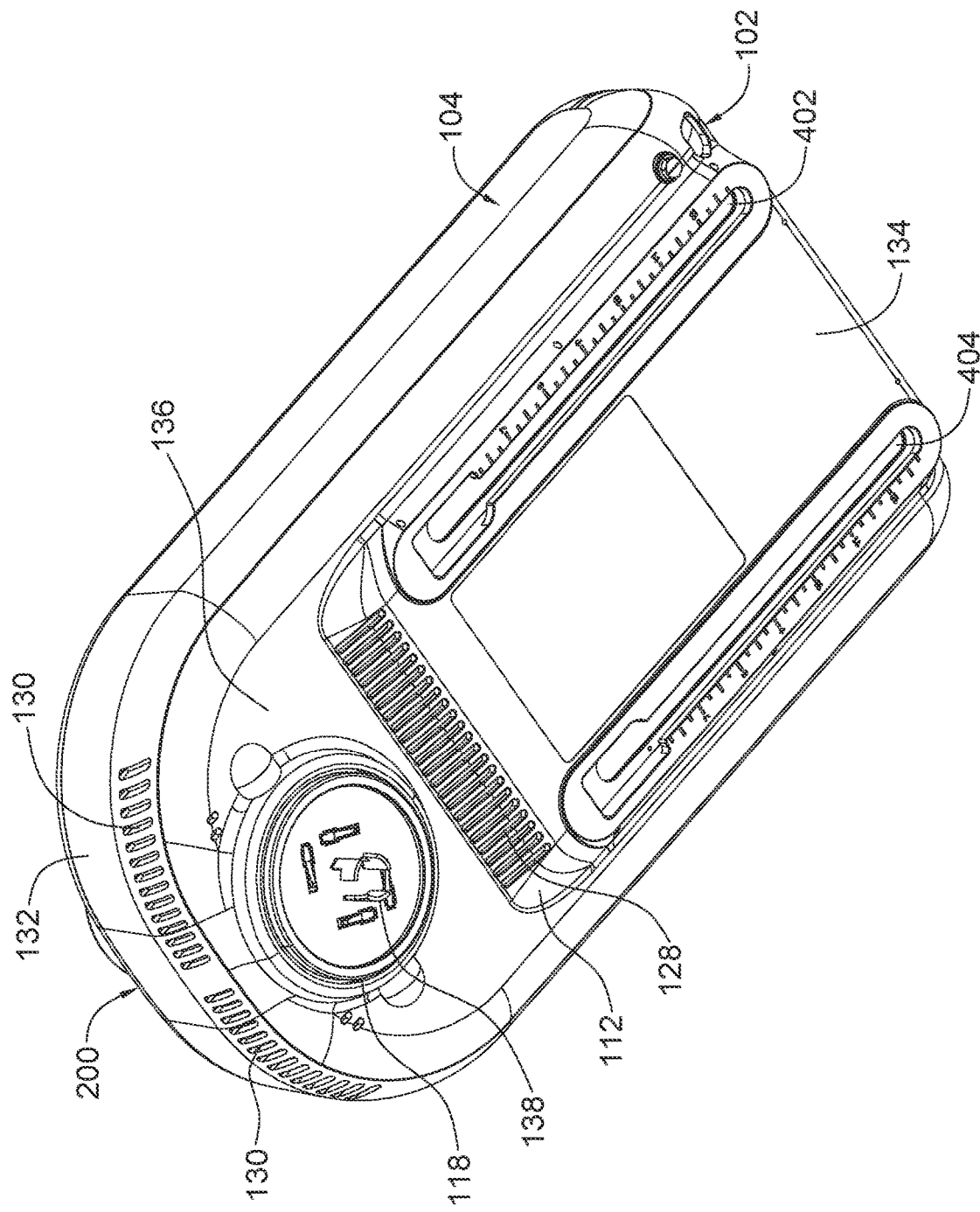
FIG. 4 shows a bottom perspective unassembled small cell access node device, in accordance with some embodiments of the present disclosure.
Figure 5:
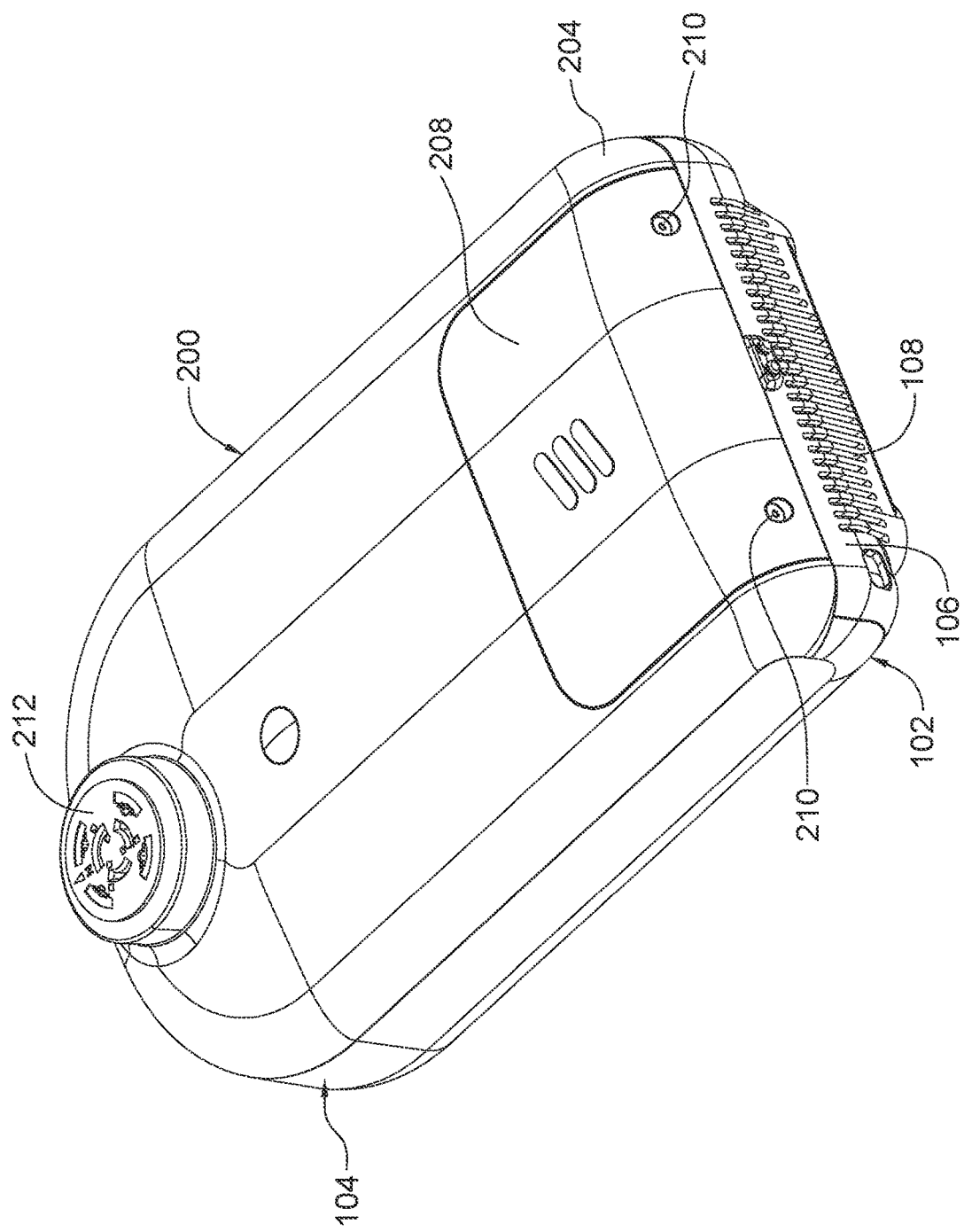
FIG. 5 shows a rear perspective view of an unassembled small cell access node device, in accordance with some embodiments of the present disclosure.

FIGS. 3-5 show various views of the housing member in different states. FIG. 3 shows a front perspective view with the lower housing member 102 and sidewall housing member 104 partially assembled. The second exhaust port 130 can be seen at the front 132 of the sidewall housing member 104 as a series of vertical slit openings through the front 132 of the sidewall housing member 104. As will be appreciated, different configurations of the openings or opening to form the second exhaust port 130 can be used. FIG. 4 shows a bottom perspective of the assembled small cell access node device in which the vertical electrical connector 138 can be seen in the opening of boss 118 and is configured to provide electrical power to components housed in the housing. Further, in FIG. 4 both the first exhaust port 128 and the second exhaust port 130 can both be seen. The first exhaust port 128 is in the transition portion 112 of the floor of the lower housing member 102, between the first floor portion and the second floor portion. Also, the undersides 134, 136 of the floor portions can be seen in this view. A pair of slots 402, 404 run in the lengthwise direction of the device and are formed in the first floor portion can provide the walls 120, 122 on the inside of the first floor portion and can provide for mechanical interconnecting to other devices or structures. In FIG. 5, the cover housing member 200 can be seen substantially covering the top of the device. The intake port 108 can be seen at the back wall 106 of the lower housing member 102. Further, the cover housing member 200 can be provided with an access door 208 that can be held in place using, for example, captured screws/bolts 210 that attach to the cover housing member 200 through the access door 208. The access door 208 is also made of a dielectric material. Additionally, the top electrical connector 212 can be provided in the cover housing member. The top electrical connector 212 is a vertically oriented electrical connector, similar to electrical connector 138 at the underside of the device, but which is a female connector that is configured to receive another device, such as, for example, a photometer to provide information about ambient light levels to an light fixture on which the small cell access node device is mounted, or to the small cell access node device itself to control the light output of a light fixture on which the small cell access node device is mounted. The top electrical connector 212 can be positioned directly over the vertical electrical connector 138.

Figure 6:
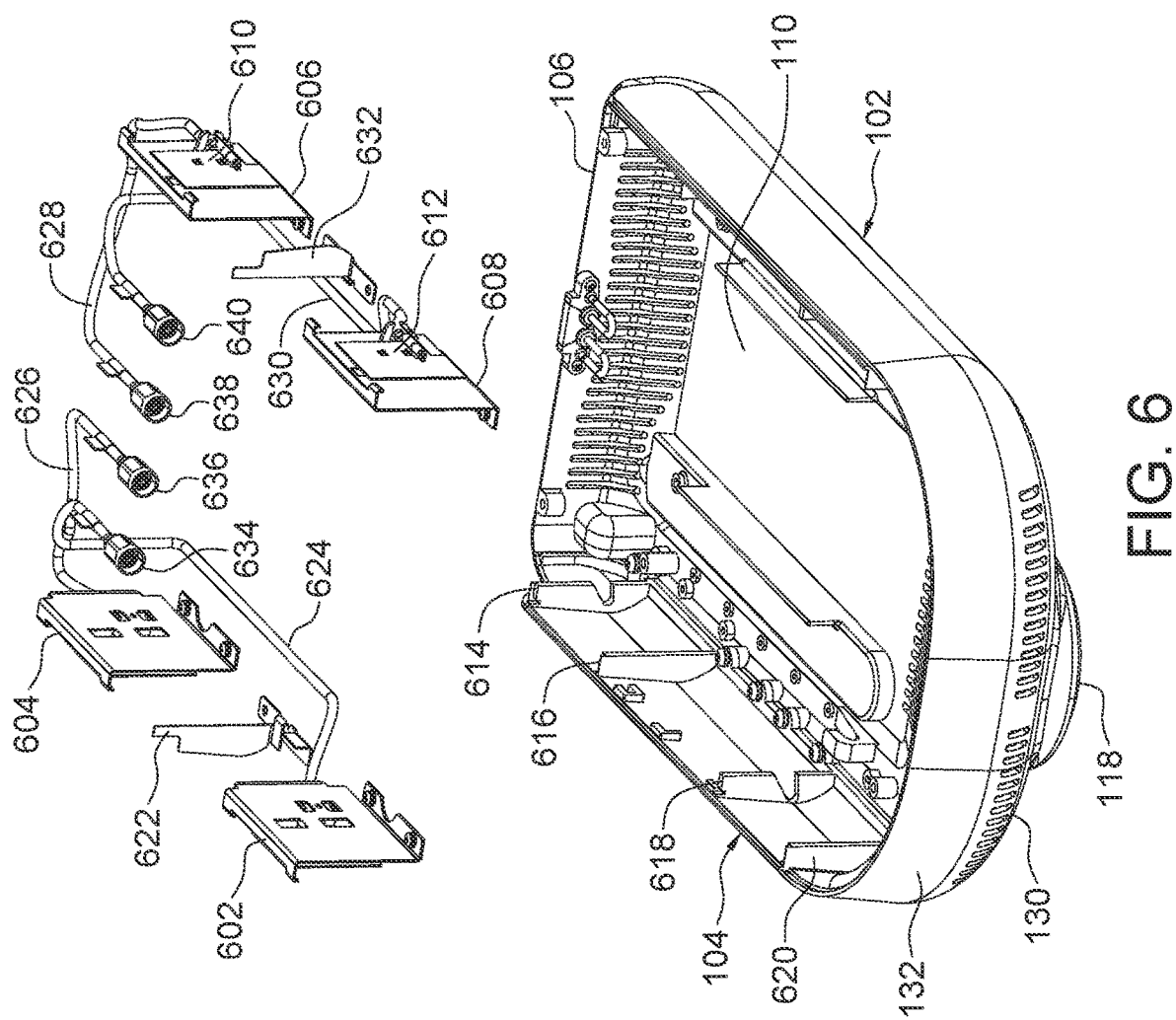
FIG. 6 shows a front perspective view partially assembled housing system for a small cell access node device in which planar antennas are assembled, in accordance with some embodiments of the present disclosure.

FIG. 6 shows a front perspective view partially assembled housing system for a small cell access node device in which planar antennas are assembled, in accordance with some embodiments of the present disclosure. As in FIGS. 1-5, the lower housing member 102 in conjunction with the sidewall housing member 104, and the back wall 106 of the lower housing member 102, define, generally, a space over the floor portions 110, 114 of the lower housing member 102. The space is bounded at the top by the cover member 200 (not shown here). Along the sidewall housing member 104 within that space there can be one or more antenna elements positioned to transmit and receive radio signals. In the present example there is shown four planar antenna units including planar antenna brackets 602, 604, 606, 608. The antenna brackets 602, 604, 606, 608 are made of an electrically conductive material and form a vertically oriented, generally planar element having an outward facing surface on which an antenna element is mounted, such as planar antenna elements 610, 612 on antenna brackets 606, 608, respectively. The antenna brackets 602, 604, 606, 608 mount on side wall features such as sidewall features 614, 616, 618, 620 which extend from the inner side of the sidewall member 104 into the internal space of the assembly, generally perpendicular to the inner surface of the sidewall member 104. In the present example antenna bracket 604 is mounted between sidewall features 614, 616 and antenna bracket 602 is mounted between sidewall features 618, 620. Further, between the antenna brackets, on each side of the sidewall housing member 104 there is a conductive blocking member 622, 632. The conductive blocking members 622, 632 are mounted on the conductive lower housing member 102 such that there is an electrical connection, and act to reduce signal interference between antenna members mounted on the antenna brackets on either side of the sidewall housing member 104. Each antenna element (e.g., 610, 612) is connected to a respective antenna cable 624, 626, 628, 630. Each of the antenna cables 624, 626, 628, 630 are terminated with a connector 634, 636, 68, 640. The antenna cables 624, 626, 628, 630 can be typical coaxial shielded cables that have a conductive core and a shielding element surrounding the core as is well known. It is important to note that the antenna elements are located inside the housing assembly. This is possible because the sidewall housing member 104 is made of a dielectric material that allows radio waves to pass through the sidewall housing member 104. By mounting the antenna elements inside the housing assembly, there is no need for externally mounted antennas, which can detract from the aesthetics of the assembly.

The antenna cables 624, 6262, 628, 630 are routed to minimize intermodulation distortion. In particular the connectors 634, 636, 638, 640 are arranged in a horizontal row to connect with mating connectors on the radio module 802 (see FIG. 8). Connectors 634 and 640 are on the outside ends of the row, and connectors 636, 638 are on the inside of the row. The outside connectors 634, 640 are coupled to cables 624, 630, which connect to the forward antenna elements 602, 608 on opposites sides of the device. Connectors 636, 638 are coupled to cables 626, 628, respectively, which are each respectively coupled to the rear antenna elements 604, 606. All the cables 624, 626, 628, 630 are routed from their respective connectors 634, 636, 638, 640, to the rear, and then horizontally to the side at the rear of the radio module 802, above the fan unit 708. At the side of the radio module 802, the cables then traverse downward. The cable 624, 630 to the forward antenna elements 602, 608 are routed along the floor of the lower house member 102, which is conductive and grounded, which reduces coupling of unwanted signals.

Figure 7:
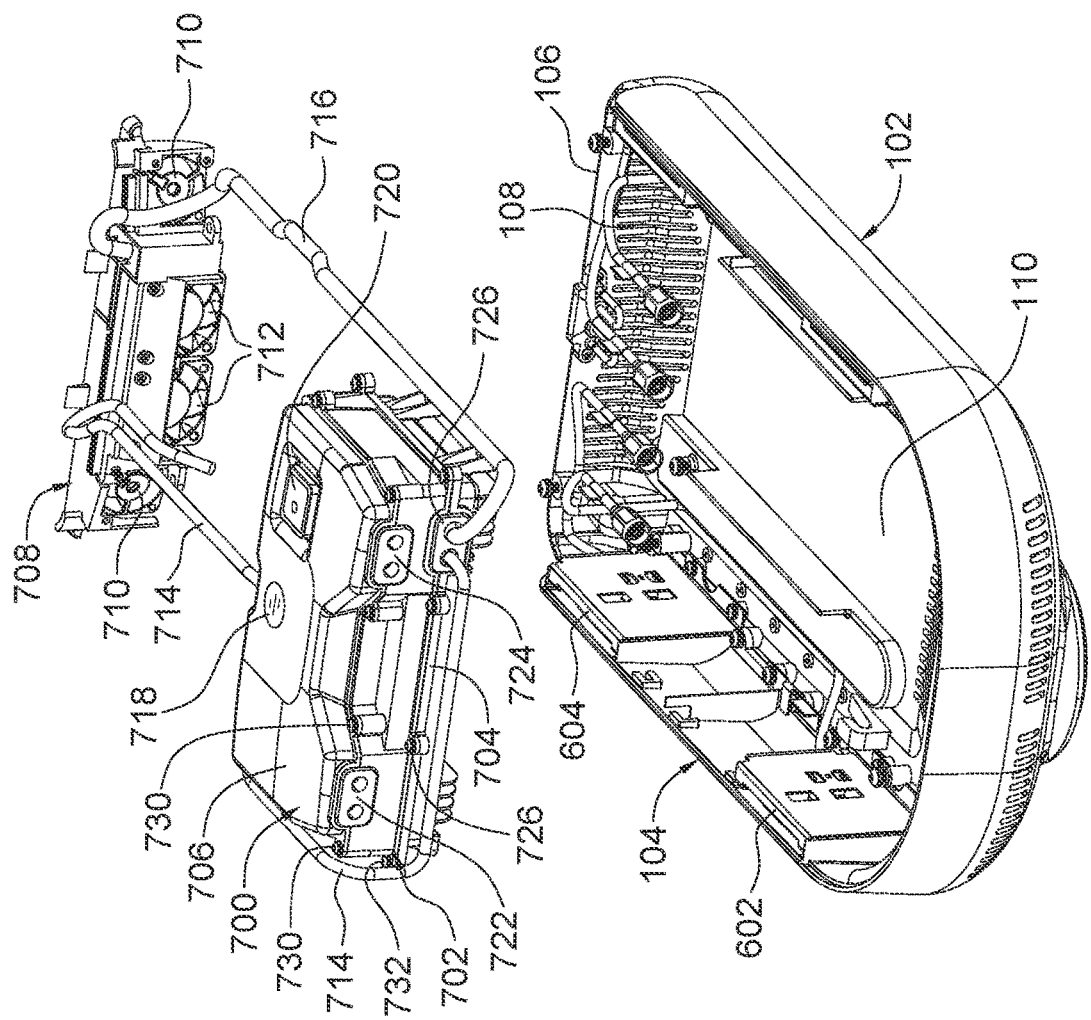
FIG. 7 shows a front perspective view partially assembled housing system for a small cell access node device as shown in FIG. 6 and in which a control and power electrical module is additionally assembled, in accordance with some embodiments of the present disclosure.

FIG. 7 shows a front perspective view partially assembled housing system for a small cell access node device as shown in FIG. 6 and in which a control and power electrical module is additionally assembled, in accordance with some embodiments of the present disclosure. Further, in this view the antenna brackets (e.g., 602, 604) are shown assembled in the housing assembly. In this view an electrical module 700 shown disposed over a portion of the floor portions 110, 114 and includes a central shielding 702, a lower or bottom shielding member 704, and a top shielding member 706. Two internal volumes are created by the shielding members 702, 704, 706. The first internal volume is formed between the central shielding member 702 and the top shielding member 706, and a second internal volume is formed between the central shielding member 702 and the bottom shielding member 704. In each of these internal volumes there are disposed different perspective circuits. A control circuit can be housed in the first internal volume between the central shielding member 702 and the top shielding member 706, and a power supply circuit can be housed in the second internal volume between the central shielding member 702 and the bottom shielding member 704. Each of the shielding members 702, 704, 706 provide sidewall portions that extend completely around the module, and the shielding members 702, 704, 706 are made of an electrically conductive material to block emission of signals or noise, as well as to prevent unwanted ingress of noise. The bottom shielding member 704 is mounted on and fastened to the floor portions 110, 114 of the lower housing member 102 such that an electrical connection is made. Likewise, the is also an electrical connection (e.g., a DC connection) between the bottom shielding member 704 and the central shielding member 702 and the top shielding member 706. Further, the central shielding member 702 provides a horizontal conductive floor or separator between the two internal volumes of the module 700, and the top shielding member 706 provides a horizontal cover over the first internal volume while the bottom shielding member 704 provides a bottom cover under the second internal volume of the module 700. Thus, the control circuit and the power supply circuit are arranged in a vertically stacked relationship. In some embodiments there can be a passage between the first and second internal volumes to allow connection of the control circuit with the power supply circuit.

Figure 11:
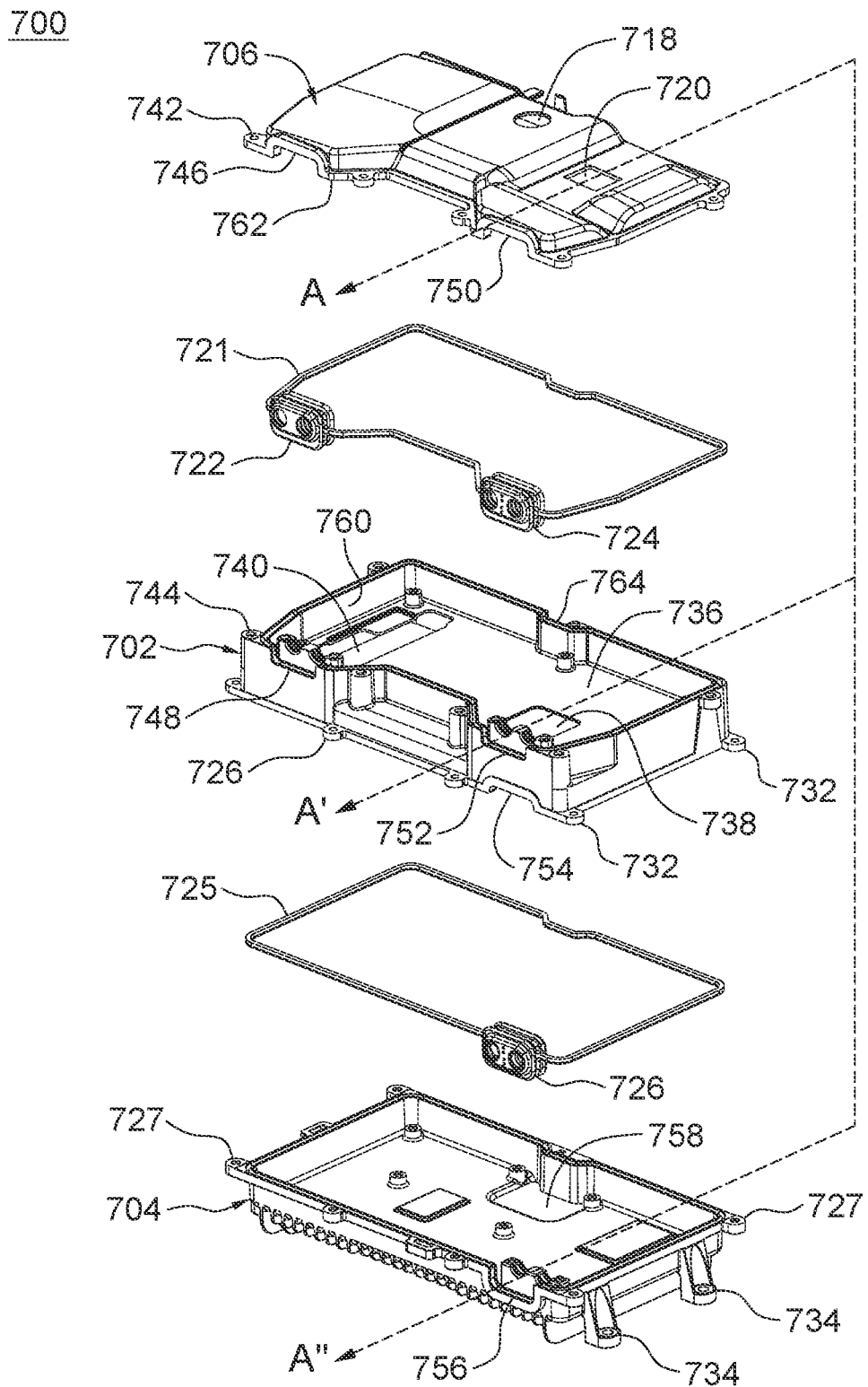
FIG. 11 shows an exploded view of a vertically stacked shielded enclosure, in accordance with some embodiments.

The electrical module 700 is shown in FIG. 11 in and exploded view, without circuit elements. Central shielding element 702 is shown between top shielding element 706 and bottom shielding element 704. These three shielding elements 702, 704, 704 house circuit components in a vertically stacked arrangement. The central shielding element 702 has a floor 736 that is surrounded by a wall 760 that extends both above and below the floor 736. The top 764 of the wall 760 interfaces with a lower periphery 762 of the top shielding element 706, and a first gasket member 721 seals the interface between the central shielding member 702 and the top shielding member 706. Cable ports or cable openings are formed between the top shielding element 706 and central shielding element 702 by raised portions 746 and 750 in the periphery of the top shielding element 706 and corresponding lowered portions 748, 752 in the top 764 of the wall 760 of the central shielding element 702. These raised and lowered portions 746, 748, 750, 752 are portions of the respective shielding elements 702, 706 that deviate away from the interface between these shielding elements 702, 706 to create openings. The openings are filled by cable plugs 722, 724 in the gasket 721. The cable plugs 722, 724 continues the watertight seal of the gasket 712 around the interface between the shielding elements 702, 706, and have openings through them that allow cabling to pass while sealing around the cables. Likewise, an opening is formed between the central shielding element 702 and the bottom shielding element 704 between raised portion 754 in the lower portion of the wall 760 of the central shielding element 702 and a lowered portion 756 in the periphery of the bottom shielding element 704. Cable plug 726 of gasket 725 fits in this opening and provides a watertight seal for cabling to pass into the lower chamber of the electrical module 700. To hold the top shielding element 706 to the central shielding element 702 (with gasket 721 disposed between their peripheries), a plurality of fastener bosses around the periphery of the top shielding element 706, such fastener boss 742, mate with corresponding fastener receivers on the central shielding element 702, such as fastener receiver 744. The fastener bosses engage the head of a fastener (e.g., screw or bolt) while the fastener receivers are threaded so that the fasteners hold the two shielding elements 702, 706 together. Likewise, the central shielding element 702 can have fastener bosses (e.g., 732) that mate with corresponding fastener receivers (e.g., 727) on the bottom shielding element 704. In some embodiments the fastener receivers can be replaced with mating fastener bosses and a nut can be used to tighten the two shielding elements together.

When assembled, an upper or top chamber is formed between the floor 736 of central shielding element 702 and the ceiling or top of the top shielding element 706 and surrounded by the wall 760 of the central shielding element 702 and any similar structure of the top shielding element 706 above their interface. Likewise, a lower or bottom chamber is formed between the floor 758 of the bottom shielding element 704 and the floor 736 of the central shielding element 702, and the bottom/lower chamber is surrounded by the walls of the bottom and central shielding elements 704, 702. The central, bottom, and top shielding members 702, 704, 706 are made of a material that inhibits transmission of electromagnetic radiation, in least in radio frequency ranges. In some embodiments the shielding members 702, 704, 706 can be made of aluminum. The bottom shielding member can have feet 734 with fastener openings in them so that the electrical module 700 can be electrically and mechanically coupled to the lower housing member 102.

In some embodiments a control circuit can be housed in the top/upper chamber, and a power supply circuit can be housed in the lower/bottom chamber. Power from the power supply circuit can be fed directly to the control circuit through openings 738, 740 in the floor 736 of the central shielding element 702 to minimize any unwanted noise pickup in the power feed cable since they are entirely within the shielding of the electrical module 700. The top of the top shielding element 706 can have an optical port 718 and a GPS antenna port 720. The optical port 718 is covered with a transparent member and is aligned with corresponding optical window (e.g., 282 of FIG. 5) in the cover 200. An optical sensor can be located under the optical port that senses ambient light in order to control operation of an external lighting element (e.g., a streetlight). The GPS antenna port allows for the installation of a satellite positioning receiver antenna to receive satellite positioning signals to allow the control circuit to determine its location as well as the present time.

Figure 12:
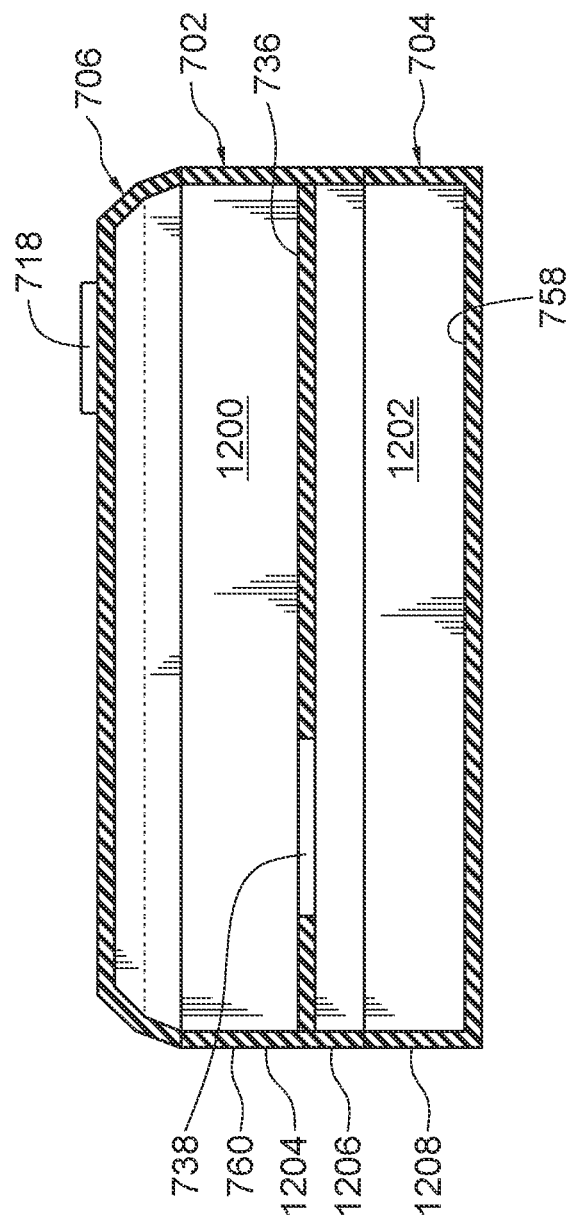
FIG. 12 shows a side cut-away view of vertically stacked shielded enclosure, in accordance with some embodiments.

FIG. 12 shows a side cut-away view of an electrical module that is substantially similar to electrical module 700. The module includes a central shielding element 702, bottom shielding element 704, and a top shielding element 706. As shown here, unlike in FIG. 11, the shielding elements 702, 704, 706 are shown assembled together. The section is taken along the lines A-A'-A" of FIG. 11. A top or upper chamber 1200 is formed between the floor 736 of the central shielding element 702 and the top shielding element 706. A lower or bottom chamber 1202 is formed between the floor 758 of the bottom shielding element 704 and the floor 736 of the central shielding element 702.

Figure 13:
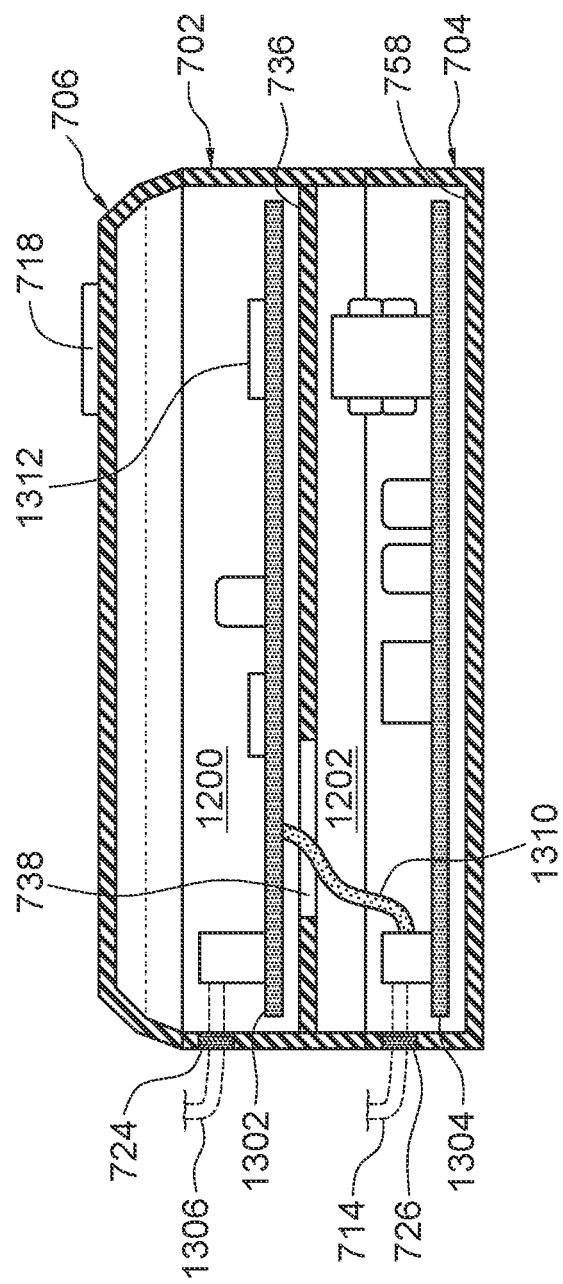
FIG. 13 shows a side cut-away view of vertically stacked shielded enclosure, including circuit elements and cables, in accordance with some embodiments.

FIG. 13 shows the same electrical module as shown in FIG. 12, with the addition of a control circuit 1302 in the upper chamber 1200, and a power circuit 1304 in the lower chamber 1202. Power, such as from power connector 138, is fed through cable plug 724 via cable 1306 to the control circuit, and from the control circuit 1302 to the power circuit 1304 through opening 738 via inter-chamber cable 1310. The power circuit 1304 converts the electrical power, typically provided as an alternating current (AC) voltage and current source, to direct current (DC) voltage levels usable by the various electrical components of the small cell device. Power can be provided from the power circuit 1304 to the control circuit 1302 through the other opening (e.g., 740) in the floor 736 of the central shielding member 702. The control circuit 1302 operates the radio module 802 at a high level and provides data to the radio module 802 that is transmitted by the radio module 802 to, for example, an administrative entity that is responsible for operation of the small cell device.

Figure 15:
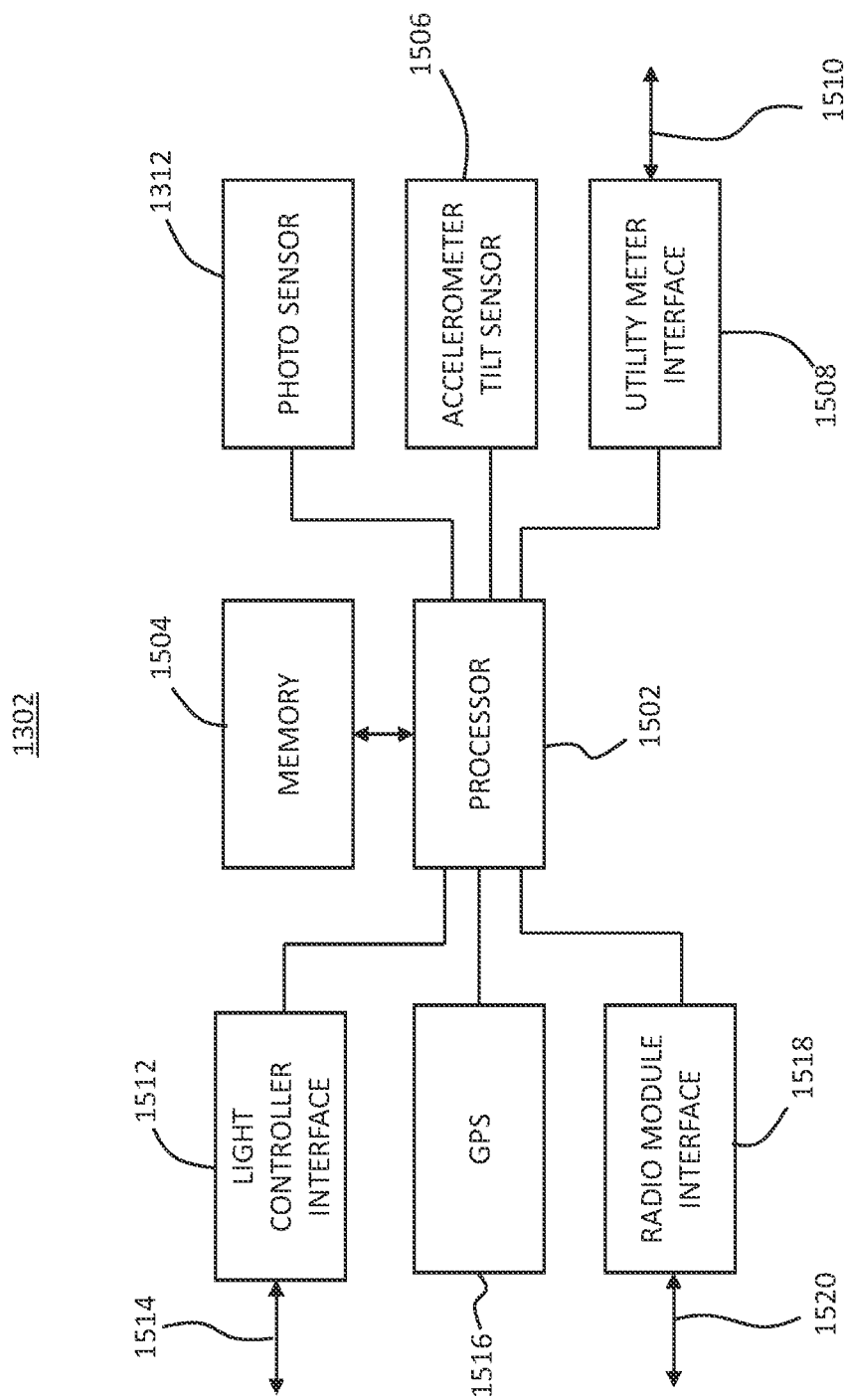
FIG. 15 is a block diagram of a control circuit for a small cell access node device, in accordance with some embodiments.

FIG. 15 shows a block schematic of a control circuit for use in a small cell access node device, which can be control circuit 1302, in accordance with some embodiments. The control circuit 1302 can include circuitry for performing a variety of tasks in conjunction with the processor 1502 and memory 1504. The processor 1502 can be a conventional microprocessor capable of performing instructions for logical and mathematical operations, as well as interfacing with and controlling other components of the small cell access node device. The memory 1504 can represent an aggregate of both volatile and non-volatile memory components used for random access memory (RAM) and read only memory (ROM), as well as reprogrammable non-volatile memory such as flash memory. Instruction code can be stored in the memory 1504 for execution by the processor 1502, and various variables and data structures can be established in the memory 1504 during operation. The processor can be interfaced with other system components. For example, a photo sensor 1312 can be located under the optical port 718 and is configured to sense the ambient light level, which is represented as a digital value. The processor 1502 can use the light intensity values to control a light control circuit through a light controller interface 1512 that is configured to control operation of an external lighting element (e.g., turn it on/off based on ambient light level). The control circuit 1302 can further include an accelerometer (e.g., microelectromechanical) 1506 for detecting tilt of the small cell device in case, for example, the small cell device becomes misaligned due to high wind or faulting mechanical attachment to a structure. Given the design of air flow ports and the presence of water exclusion/elimination features, as well as the directionality of its antennas, it is important the small cell device remain substantially in a level position for these elements to operate as intended.

The control circuit 1302 can also operate as utility or power meter and provide communications as to the consumption of a resource such as electric power to a utility entity. A utility meter interface 1508 allows the processor to communicate with a conventional metering circuit (not shown) that measures, for example, electrical power consumption. A GPS receiver 1516 can provide location information, of course, but also timing control since GPS signals contain very accurate time signals for determining the time of day and the date. The time can be used for logging data and can further be used by the radio module 802 for time division operation in the air interface (i.e., coordinating time slots). The utility meter interface 1508, light controller interface 1512, and radio module interface 1518 provide the functionality to allow the processor 1502 to communicate with and/or control the corresponding components, and can include circuitry external to the processor 1502, or can be on-board serial communication circuits in the processor 1502. The utility meter interface 1508, for example, allows the processor to communicate with a metering component as indicated by arrow 1510. Light controller interface 1512 allows the processor 1502 to control a light component (e.g., a streetlight) via signal 1514. Likewise, the radio module interface 1518 allows the processor to communicate with the radio module 802, as indicated by arrow 1520, to allow the processor to send data to and receive data from the radio module for transmission to, or to receive from another entity via the radio air interface. Thus, the processor 1502 can act as a client or subscriber to the radio module 802, and transmit, for example various logs, component status reports, diagnostic data, and so on.

Figure 14:
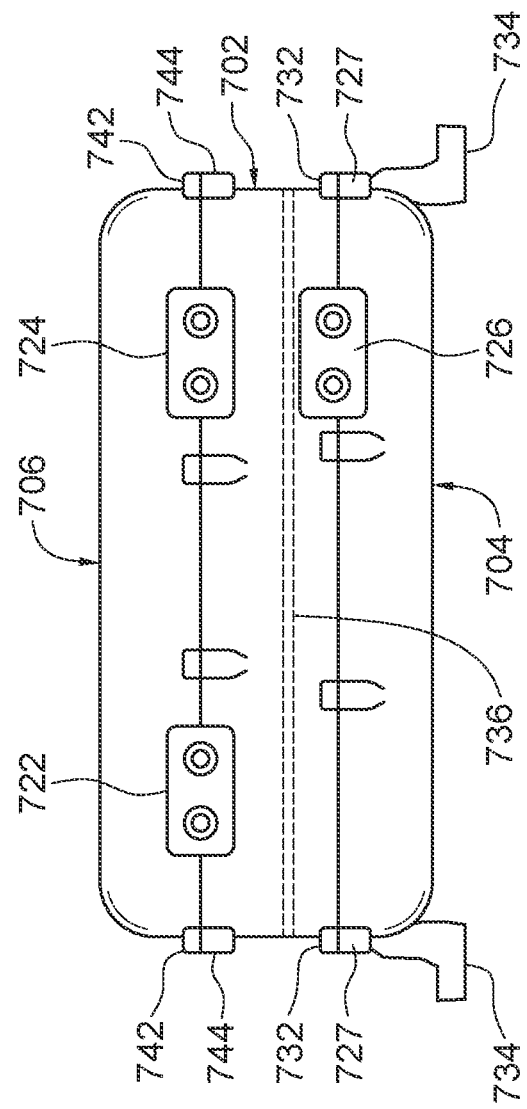
FIG. 14 shows a front side elevational view of vertically stacked shielded enclosure, in accordance with some embodiments.

FIG. 14 shows a front side elevational view of an electrical module including a central shielding element 702, a bottom shielding element 704, and a top shielding element 706. As indicated in reference to FIG. 11, openings are formed between the shielding elements 702, 704, 706 in which gasket plugs 722, 724, 726 are disposed. The gasket plugs are made of a resilient material to conform and seal between the gasket plugs and the shielding elements. Each gasket plug 722, 724, 726 can have cable openings through which cable pass to connect to the circuits housed inside the electrical module. The openings are sized to be slightly smaller than the diameter of the cables to ensure a seal between the cables and the cable plugs.

Thus, the shielded enclosure 700 is an electrical module that is, more specifically, a combination control circuit and power supply module for a small cell access node apparatus that includes a lower shielding member 704 that has a bottom 758 that forms a floor, and a sidewall 781 that extends upwards, away from the bottom 758, around a periphery of the bottom 758. The module includes a central shielding member 702 conductively coupled to the lower shielding member 704, and has a central floor 736, and further has a sidewall 760 around a periphery of the central floor 736. The sidewall 760 of the central shielding member 702 has a lower portion 1206 that extends away from the central floor 736 in a first direction (e.g., downward) and which meets the sidewall 781 of the lower shielding member 704. The sidewall 760 of the central shielding member 702 further has an upper portion 1204 that extends (e.g., upward) from the central floor 736 in a second direction opposite that of the first direction, and thereby encloses a lower chamber between the bottom 758 of the lower shielding member 704 and a lower or bottom side of the central floor 736 of the central shielding member 702 and the lower portion 1206 of the sidewall 760 of the central shielding member 702 and the sidewall 781 of the lower shielding member 704. The electrical module further includes a top shielding member 706 conductively coupled to the central shielding member 702 and has a ceiling or top 783 and a sidewall 785. The sidewall 785 of the top shielding member 706 extends away from the ceiling 783 about a periphery of the ceiling 783 to meet the upper portion of the sidewall 760 of the central shielding member 702 thereby enclosing an upper chamber between an upper side of the central floor 736 and the ceiling 783 of the top shielding member 706 and by the upper portion 1204 of the sidewall 760 of the central shielding member 702 and the sidewall 785 of the top shielding member 706. The electrical module can include a power supply circuit 1304 disposed in the lower chamber 1202, and a control circuit 1302 disposed in the upper chamber 1200.

Returning to FIG. 7 there is also shown a fan unit 708 that includes one or more fans and is located near the rear air intake grate 108 of the rear wall 106 of the lower housing member 102. The fan unit 708, as shown here, includes two outer fans 710 and two inner fans 712. The outer fans 710 are positioned and oriented to blow air along the sides of the housing assembly while the inner fans 712 are positioned to blow air under the electrical module(s) housed inside the housing assembly. The inner fans 712 also help to push any water that enters the unit towards the first exhaust port 128. The fan unit 708 receives power via a fan power cable 716 from the power supply circuit in front electrical module 700. A radio power cable 714 is also shown that provides power to the radio module (not shown here). Both the fan power cable 716 and the radio power cable 714 can be shielded to reduce unwanted noise intrusion or transmission into or from the cables 714, 716.

Furthermore, the power cable 714 and fan power cable 716 are routed on opposite sides of the electrical module 700 and the radio module 802, from the front of the electrical module 700 at gasket plug 726. Radio power cable 714 runs horizontally across the front of the electrical module 700 to the opposite side of the electrical module 700 from the fan power cable 716, and then up to the top of the electrical module 700 and to the back and then down along the floor of the lower housing member. The fan power cable is routed to the side of the electrical module 700 and down, along the standoffs of the electrical module 700 and along the floor of the lower housing member 102 to the fan unit 708 at the back of the device. Separating the cables 714, 716 reduces common mode couple that can occur due to signals from the antenna elements on each side of the device.

Figure 8:
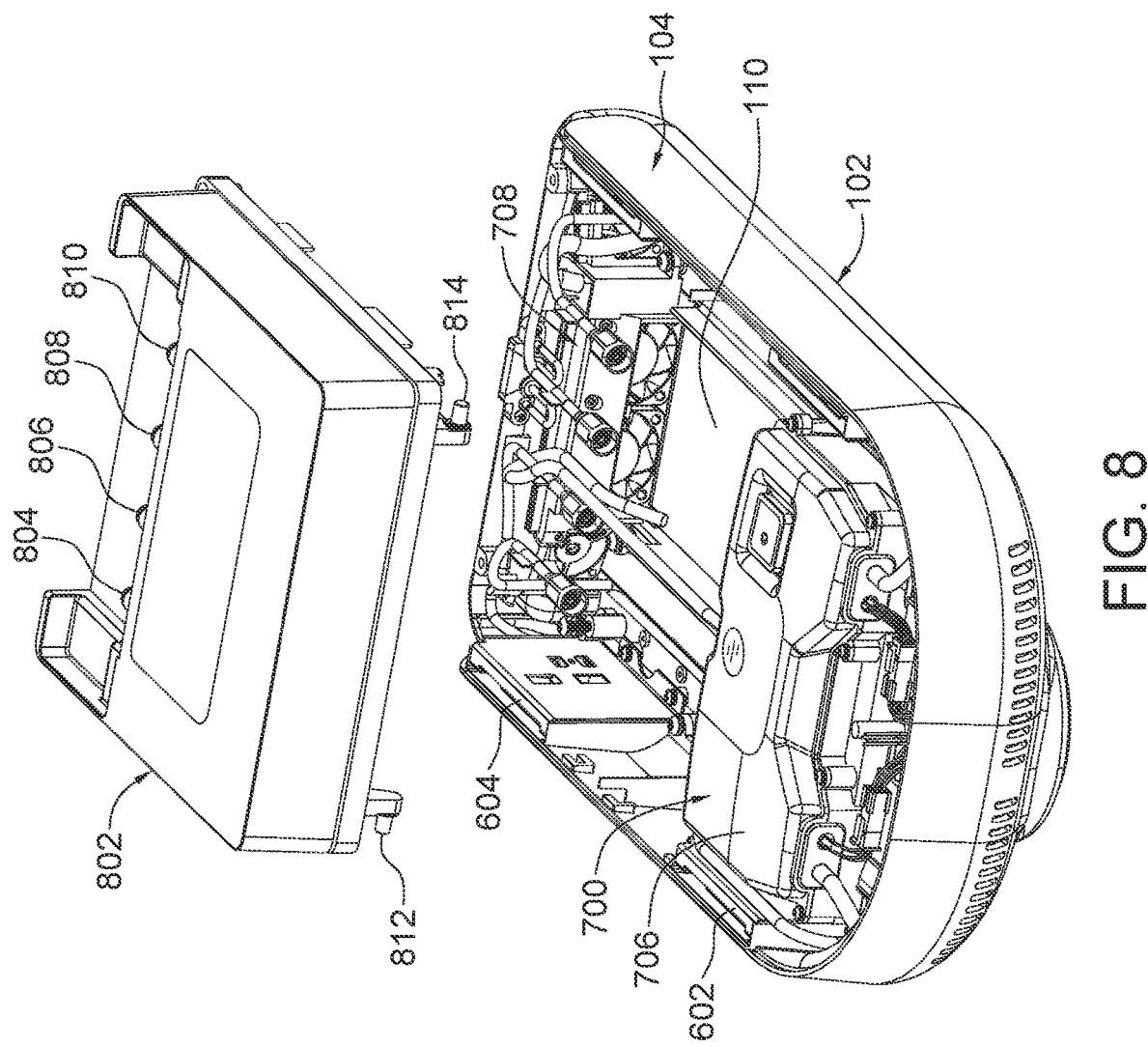
FIG. 8 shows a front perspective view partially assembled housing system for a small cell access node device as shown in FIG. 7 and in which a radio module is additionally assembled, in accordance with some embodiments of the present disclosure.

FIG. 8 shows a front perspective view partially assembled housing system for a small cell access node device as shown in FIG. 7 and in which a radio module 802 is additionally assembled, in accordance with some embodiments of the present disclosure. In addition to the front electrical module 700, the housing assembly can further include a radio module 802. The radio module includes radio circuitry for wireless communications as a small cell device, including communicating locally with mobile devices, and relaying signals between mobile devices and a terrestrial communications infrastructure for voice and data communications. In some embodiments the radio module 802 includes a high power radio transceiver that can operate at an average power output of at least four watts per transmitter branch. The radio module 802 includes a plurality of antenna connectors 804, 806, 808, 810 for each of several branches that are used to connect to connectors 634, 636, 638, 640 and thereby to the antenna elements on antenna brackets 602, 604, 606, 608. This arrangement allows the radio module to operate according to a multiple-input, multiple-output (MIMO) radio interface configuration. In some embodiments, a 2×2 MIMO arrangement can be used, and in other embodiments a 4×4 MIMO arrangement can be used. The radio power cable 714 provides power to the radio module, and inner fans 712 blow air over fins on the bottom of the radio module 802. The radio module 802 sits between the electrical module 702 and the fan unit 708 over the floor portions 110, 114 of the lower housing member 102. At the bottom of the front side of the radio module 802 are a pair of opposing mounting rods 812, 814. The mounting rods 812, 814 are horizontally oriented with one at each of the lower front corners, along a coaxial axis, and are configured to fit into receiving hooks 142, 140, respectively, on the floor portions 110, 114 of the lower housing member 102. This allows the radio module to be inserted into, or removed from, the assembled housing assembly through door 208. The radio module 802 includes a conductive housing that provides radio shielding, and which can be fastened to the floor portions 110, 114 in addition to engagement of the mounting rods 812, 814 with receiving hooks 140, 142. When the mounting rods 812, 814 are engaged in the receiving hooks 140, 142 then other fastener locations on the radio module 802 will be aligned with fastener bosses on the floor portions 110, 114 of the lower housing member 102.

Figure 9:
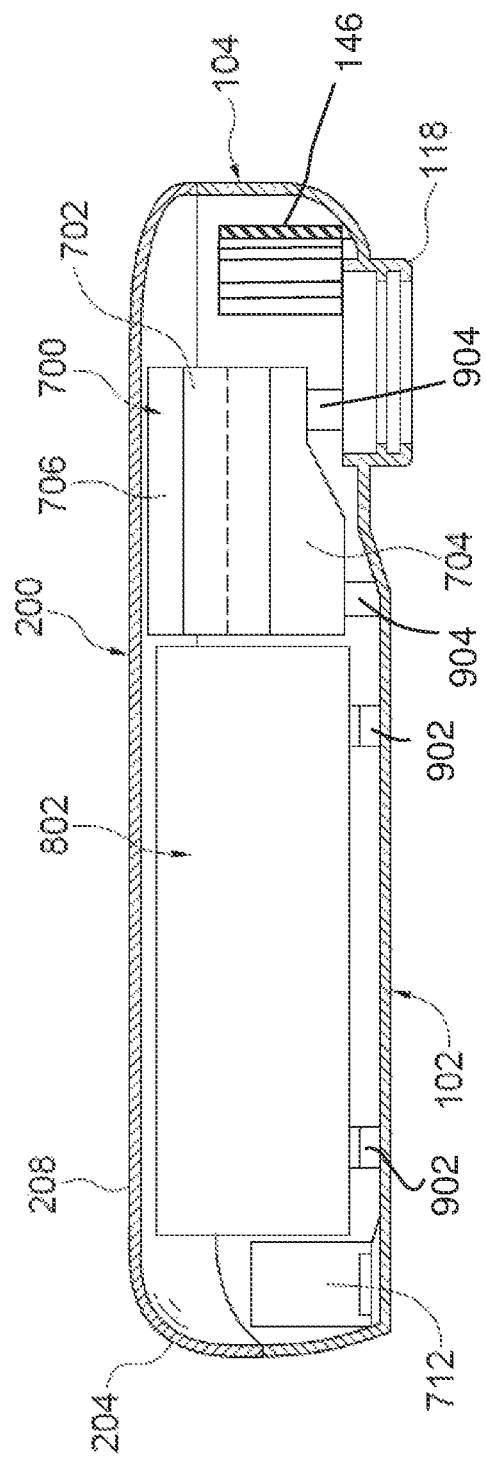
FIG. 9 shows a partial side cutaway view of an assembled small cell access node device, in accordance with some embodiment of the present disclosure.

FIG. 9 shows a partial side cutaway view of an assembled small cell access node device, in accordance with some embodiment of the present disclosure. In the present view of FIG. 9, the lower housing member 102, the sidewall housing member 104, the cover housing member 200, and the door 208 are sectioned along a line through the middle of the assembly in a direction from the front to the back of the assembly. The interior components are represented positionally, and not necessarily cross sectioned. As used herein, the front of the device is on the right side, and the rear or back of the device is on the left side of the drawing. Inside the housing members 102, 104, 200 the electrical module 700 is housed, and includes the top shielding member 706, the central shielding member 702, and the bottom shielding member 704. The electrical module 700 is disposed over a portion of the floor of the lower housing member 102 that is raised or elevated with respect to the more rearward section of the that is occupied by the radio module 802. Both the electrical module 700 and radio module 802 are fastened to the lower housing member 102. Note that other elements such as, for example, the antenna brackets, are not shown in this view, but such elements as shown in the preceding drawings would be present in the assembled and operational device. In this view, the radio module 802 and the electrical module 700 are both raised on standoffs 902, 904, respectively. This allows water to flow under these modules 802, 700. Water blown in through the front or rear ports (e.g., 108, 130) during rainstorms is allowed to flow out through the exhaust port (e.g., 128) in the floor of the lower housing member. Dam 146 prevents wind-blown water from getting to the electrical module 700, and the blocked water accumulates and flows under the dam 146 to drain through the bottom of the lower housing member 102.

Figure 10:
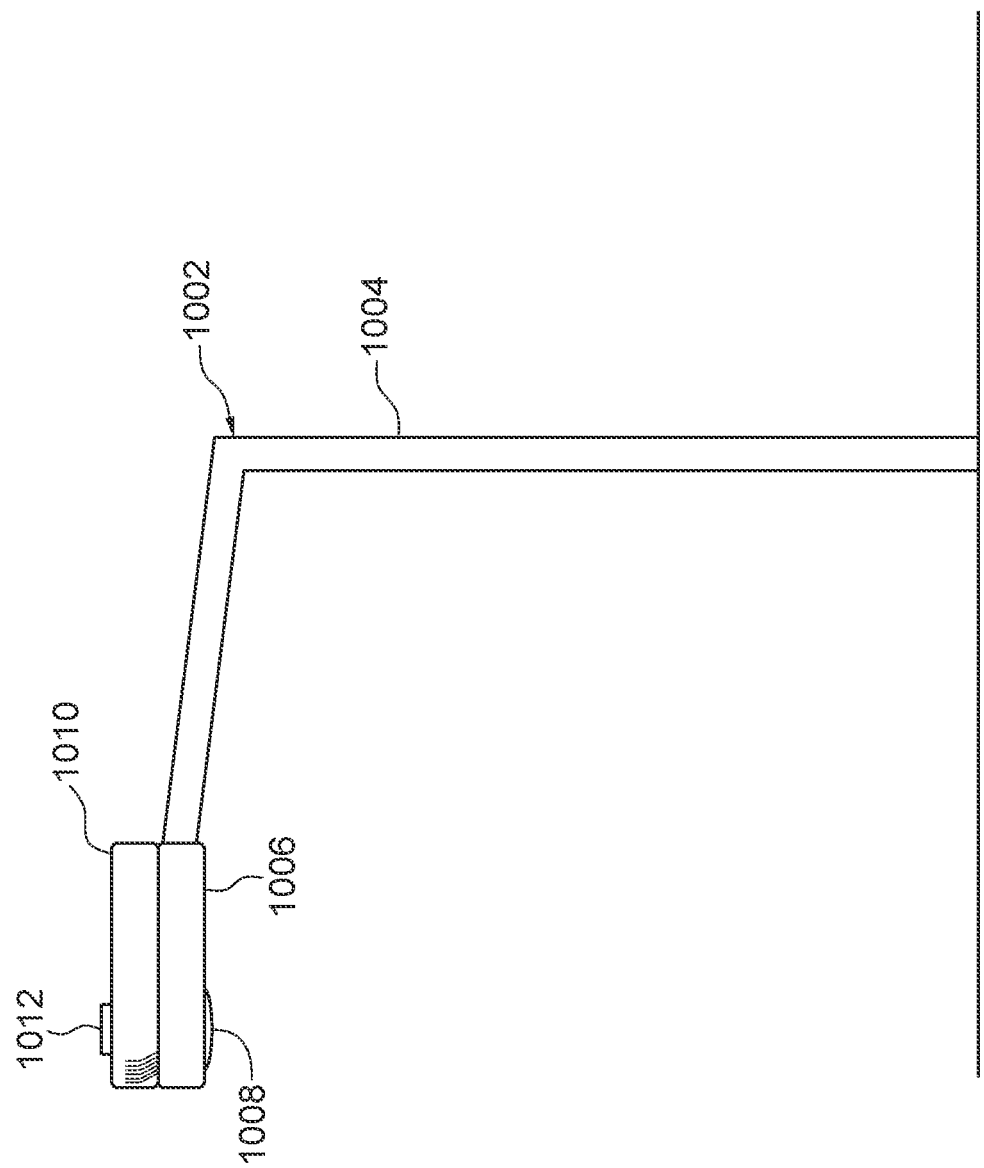
FIG. 10 shows a small cell access node device mounted on a streetlight, in accordance with some embodiments.

FIG. 10 shows a small cell access node mounted on a streetlight, in accordance with some embodiments. The streetlight 1002 includes a mast 1004 and a light element 1006. The mast 1004 can include a ground-mounted pole that generally extends upward from the ground and then extends outward over the ground/street. The light element 1006 includes circuitry and a lamp 1008 that emits light downward towards the ground below. In some embodiments, the mast 1004 can extend from a structure (e.g., a bridge or building) rather than being mounted in the ground. The light element 1006 includes, on its top side, an electrical connector. The small cell access node 1010 is mounted on top of the light element 1006 and is configured and assembled substantially as shown in FIGS. 1-9. Thus, an electrical connector of the small cell access node device 1010, such as electrical connector 138, can mate with the electrical connector on the top of the light element 1006. The small cell access node device 1010 can itself include an electrical connector such as connector 212 on its cover/top. The materials used in the constructing the small cell access node device 1010 help minimize its weight and volume, which are important when mounting on the light element 1006 because the mounting of the light element 1006 on the mast 1004 must meet specified loading requirements.

The control circuit 1302 can include a photo sensor 1312 and a light controller interface 1512, as shown in FIG. 15, to allow the control circuit 1302 to control the lamp 1008 of the light element 1006 in response to ambient light. The photo sensor 1312 produces a value indicative of the present level of ambient light. As the light level decreases below a threshold, the processor 1502 can control the lamp 1008, either directly or through a control circuit in the light element 1006, to turn on. Likewise, in the morning, as the ambient light level increases, the lamp 1008 can be shut off.

The foregoing disclosure has described embodiments of a small cell access node device housing assembly. The assembly utilizes an electrically conductive lower housing member that provides sufficient rigidity and strength to support the assembly and the components contained within the housing assembly. Being conductive, the lower housing member also provides a shielding benefit for electromagnetic noise. By making the remaining portions of the housing assembly out of non-conductive materials, the weight of the assembly is minimized, and the antenna elements can be housing inside the assembly, rather than the being externally mounted, which can enhance the aesthetic appeal of the small cell access node device.

The claims appended hereto are meant to cover all modifications and changes within the scope and spirit of the present disclosure.

What is claimed is:

1. A small cell access node comprising:
   a housing including a floor and at least one sidewall extending around a perimeter of the floor, an air intake section of the at least one sidewall being located at a first lengthwise end of the floor and defining an air intake port, an air exhaust section of the at least one sidewall being located at a second lengthwise end of the floor and defining an air exhaust port, the floor including a first floor portion residing primarily in a first plane, a second floor portion residing primarily in a second plane, and a transition portion interconnecting the first floor portion and the second floor portion, the transition portion defining an air and water exhaust port;
   a radio transceiver module positioned within the housing over and spaced apart from the first floor portion so as to form a first air and water flow channel between the radio transceiver module and the first floor portion;
   a power supply module positioned within the housing over at least the second floor portion and spaced apart from the second floor portion so as to form a second air and water flow channel between the power supply module and the second floor portion;
   an electrical power connector positioned in an opening defined by the second floor portion of the housing and electrically coupled to the power supply module, the electrical power connector being connectable to an external power connector of a lighting fixture; and
   a plurality of antennas configured in a predetermined arrangement within the housing, the plurality of antennas being electrically coupled to the radio transceiver module.

2. The small cell access node of claim 1, wherein the plurality of antennas permit one of 2×2 and 4×4 multiple-input, multiple-output (MIMO) operation by the radio transceiver module.

3. The small cell access node of claim 1, wherein the first floor portion and the second floor portion are sloped toward the transition portion.

4. The small cell access node of claim 1, further comprising:
   a fan unit positioned proximate the air intake port to draw air into the housing and force the air to move under the radio transceiver module, under the power supply module, and out of the housing through at least one of the air exhaust port and the air and water exhaust port.

5. The small cell access node of claim 1, further comprising:
   a dam member positioned proximate the air exhaust port, the dam member including a solid dam wall spaced from the air exhaust port to allow air to flow over a top of the dam wall and out of the housing through the air exhaust port, wherein the dam wall is impassible to liquid.

6. The small cell access node of claim 5, further comprising:
   a lighting control circuit operable to control operation of a lighting fixture to which the electrical power connector is connected.

7. The small cell access node of claim 6, further comprising:
   a multi-chambered shield enclosure electrically coupled to the floor of the housing, the enclosure defining a first chamber in which the power supply module is positioned and a second chamber in which the lighting control circuit is positioned, wherein the first chamber and the second chamber of the enclosure are arranged in a vertical relationship.

8. The small cell access node of claim 1, further comprising:
   a lighting control circuit operable to control operation of a lighting fixture to which the electrical power connector is connected.

9. The small cell access node of claim 8, further comprising:
   a multi-chambered shield enclosure electrically coupled to the floor of the housing, the enclosure defining a first chamber in which the power supply module is positioned and a second chamber in which the lighting control circuit is positioned, wherein the first chamber and the second chamber of the enclosure are arranged in a vertical relationship.

10. A small cell access node comprising:
    an electrically conductive lower housing member including a floor and a wall proximate a first end of the floor, the wall defining an air intake port, the floor defining an air and water exhaust port;
    an electrically non-conductive sidewall housing member attached to the floor and the wall, the sidewall housing member defining an air exhaust port and being attached to the lower housing member such that the air exhaust port is positioned proximate a second end of the floor;
    a dam positioned proximate the air exhaust port, the dam including a solid dam wall that is spaced from the air exhaust port so as to allow air to flow over a top of the dam wall and through the air exhaust port, wherein the dam wall is impassible to liquid;

a cover attached to a top portion of the sidewall housing member, wherein the cover, the lower housing member, and the sidewall housing member define an internal chamber;

a radio module positioned within the internal chamber closer to the air intake port than the air exhaust port; and a shield enclosure positioned within the internal chamber between the radio module and the air exhaust port, the shield enclosure being electrically coupled to the lower housing member and including at least a power supply module.

11. The small cell access node of claim 10, wherein the floor includes a first floor portion residing primarily in a first plane, a second floor portion residing primarily in a second plane, and a transition portion interconnecting the first floor portion and the second floor portion, the transition portion being angled and defining an air and water exhaust port.

12. The small cell access node of claim 11, wherein first floor portion and the second floor portion are sloped toward the transition portion.

13. The small cell access node of claim 10, further comprising:

an electrical power connector disposed in an opening defined by the floor and electrically coupled to the power supply module, the electrical power connector being connectable to an external power connector of a lighting fixture.

14. The small cell access node of claim 13, further comprising:

a lighting control circuit operable to control operation of a lighting fixture to which the electrical power connector is connected.

15. The small cell access node of claim 10, further comprising:

a plurality of antennas configured in a predetermined arrangement within the internal chamber, the plurality of antennas being electrically coupled to the radio module.

16. The small cell access node of claim 10, wherein the shield enclosure defines a first chamber in which the power supply module is positioned and a second chamber in which a lighting control circuit is positioned, and wherein the first chamber and the second chamber are oriented vertically.

* * * * *